(12) United States Patent
Kim et al.

(10) Patent No.: US 11,516,930 B2
(45) Date of Patent: Nov. 29, 2022

(54) METHOD FOR MANUFACTURING EXTERIOR HOUSING AND ELECTRONIC DEVICE COMPRISING SAME

(71) Applicant: Samsung Electronics Co., Ltd., Gyeonggi-do (KR)

(72) Inventors: Young-Gyun Kim, Gyeonggi-do (KR); Minjung Kim, Gyeonggi-do (KR); Jeeyoung Oh, Gyeonggi-do (KR); Gyoosug Lee, Gyeongsangbuk-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 69 days.

(21) Appl. No.: 16/942,908

(22) Filed: Jul. 30, 2020

(65) Prior Publication Data

US 2020/0367376 A1 Nov. 19, 2020

Related U.S. Application Data

(63) Continuation of application No. 15/751,212, filed on Feb. 8, 2018, now Pat. No. 10,750,629, which is a
(Continued)

(30) Foreign Application Priority Data

Aug. 11, 2015 (KR) .................... 10-2015-0113076

(51) Int. Cl.
*H05K 5/02* (2006.01)
*B32B 27/08* (2006.01)
(Continued)

(52) U.S. Cl.
CPC ......... *H05K 5/0217* (2013.01); *B29C 43/003* (2013.01); *B29C 43/02* (2013.01);
(Continued)

(58) Field of Classification Search
CPC ...... H05K 5/0217; H05K 5/00; H05K 5/0017; H05K 5/02; B29C 43/003; B29C 43/02;
(Continued)

(56) References Cited

U.S. PATENT DOCUMENTS 10,750,629 B2 * 8/2020 Kim ..................... B32B 27/365
2002/0106952 A1 8/2002 Hashizume et al.
(Continued)

FOREIGN PATENT DOCUMENTS

CN 101077672 A 11/2007
CN 101337419 A 1/2009
(Continued)

OTHER PUBLICATIONS

Shu et al.; "Application of multi-component and multi-layer film by multi-arc ion plating on the forming punch for battery shell"; 2011.
(Continued)

*Primary Examiner* — James Wu
*Assistant Examiner* — Hung Q Dang
(74) *Attorney, Agent, or Firm* — Cha & Reiter, LLC

(57) ABSTRACT

An electronic device of the present invention comprises: an exterior housing including a first surface facing a first direction, and a second surface facing a second direction opposite to the first direction; a display of which at least a part is exposed through the first surface; and a polymer plate which forms at least a part of the second surface of the housing. The polymer plate comprises: at least one opaque layer; at least one polymer layer that is translucent or transparent and is disposed on the at least one opaque layer; and a coating layer that is disposed on the at least one polymer layer and has a hardness greater than or equal to a selected hardness. Each of the at least one opaque layer, the at least one polymer layer, and the coating layer may comprise a first surface, and a second surface extending
(Continued)

from the first surface so that at least a part thereof is bent. Other embodiments are also possible.

23 Claims, 30 Drawing Sheets

Related U.S. Application Data continuation of application No. PCT/KR2016/005547, filed on May 26, 2016.

(51) Int. Cl.

| | | |
|---|---|---|
| B32B 27/30 | (2006.01) | |
| B32B 27/36 | (2006.01) | |
| H04M 1/02 | (2006.01) | |
| H05K 5/00 | (2006.01) | |
| B32B 1/00 | (2006.01) | |
| B29C 43/00 | (2006.01) | |
| B29C 43/02 | (2006.01) | |
| B29C 43/50 | (2006.01) | |
| B29C 43/52 | (2006.01) | |
| B29K 33/00 | (2006.01) | |
| B29K 69/00 | (2006.01) | |
| B29K 105/00 | (2006.01) | |
| B29L 31/34 | (2006.01) | |

(52) U.S. Cl.
CPC ............. *B29C 43/50* (2013.01); *B29C 43/52* (2013.01); *B32B 1/00* (2013.01); *B32B 27/08* (2013.01); *B32B 27/308* (2013.01); *B32B 27/36* (2013.01); *B32B 27/365* (2013.01); *H04M 1/02* (2013.01); *H05K 5/00* (2013.01); *H05K 5/0017* (2013.01); *H05K 5/02* (2013.01); *B29K 2033/12* (2013.01); *B29K 2069/00* (2013.01); *B29K 2105/256* (2013.01); *B29K 2995/0026* (2013.01); *B29L 2031/3481* (2013.01); *B32B 2255/10* (2013.01); *B32B 2307/41* (2013.01); *B32B 2307/412* (2013.01); *B32B 2333/12* (2013.01); *B32B 2369/00* (2013.01); *B32B 2457/00* (2013.01); *B32B 2457/20* (2013.01)

(58) Field of Classification Search
CPC ........... B29C 43/50; B29C 43/52; B32B 1/00; B32B 27/08; B32B 27/308; B32B 27/36; B32B 27/365; H04M 1/02
See application file for complete search history.

(56) References Cited

U.S. PATENT DOCUMENTS

| | | | |
|---|---|---|---|
| 2003/0083094 A1 | 5/2003 | Hsu et al. | |
| 2005/0130721 A1* | 6/2005 | Gartrell | H04M 1/0283 455/575.8 |
| 2007/0026205 A1 | 2/2007 | Anton et al. | |
| 2007/0160831 A1 | 7/2007 | Hseih et al. | |
| 2007/0196633 A1 | 8/2007 | Coak et al. | |
| 2007/0295031 A1 | 12/2007 | Utsugi | |
| 2008/0004088 A1 | 1/2008 | Lundell et al. | |
| 2009/0104441 A1 | 4/2009 | Sawada | |
| 2009/0208756 A1 | 8/2009 | Kimura et al. | |
| 2010/0033810 A1 | 2/2010 | Haida | |
| 2010/0289187 A1 | 11/2010 | Bae et al. | |
| 2011/0059348 A1 | 3/2011 | Rothkopf et al. | |
| 2011/0157866 A1 | 6/2011 | Li et al. | |
| 2012/0295045 A1 | 11/2012 | Tang et al. | |
| 2013/0034685 A1* | 2/2013 | An | H01L 51/524 156/222 |
| 2013/0140965 A1 | 6/2013 | Franklin et al. | |
| 2013/0309460 A1 | 11/2013 | Saito et al. | |
| 2013/0329346 A1 | 12/2013 | Dannoux et al. | |
| 2014/0134429 A1 | 5/2014 | Weber et al. | |
| 2014/0233194 A1 | 8/2014 | Hongo et al. | |
| 2015/0015780 A1* | 1/2015 | Graham | H04N 5/2252 348/376 |
| 2015/0022475 A1 | 1/2015 | Watanabe et al. | |
| 2016/0046049 A1 | 2/2016 | Yun et al. | |
| 2016/0066440 A1 | 3/2016 | Choi et al. | |
| 2016/0075057 A1* | 3/2016 | Yamazawa | B29C 39/10 428/339 |
| 2017/0106632 A1 | 4/2017 | Noda | |
| 2017/0305132 A1* | 10/2017 | Dollase | B32B 15/18 |

FOREIGN PATENT DOCUMENTS

| | | | |
|---|---|---|---|
| CN | 101600513 A | 12/2009 | |
| CN | 101659143 A | 3/2010 | |
| CN | 101730417 A | 6/2010 | |
| CN | 102233781 A | 11/2011 | |
| CN | 102365007 A | 2/2012 | |
| CN | 103128976 A | 6/2013 | |
| CN | 103730061 A | 4/2014 | |
| CN | 103996357 A | 8/2014 | |
| CN | 104094202 A | 10/2014 | |
| CN | 203930740 U | 11/2014 | |
| CN | 104487497 A | 4/2015 | |
| CN | 104553184 A | 4/2015 | |
| CN | 104619655 A | 5/2015 | |
| CN | 104703770 A | 6/2015 | |
| EP | 2 860 025 A1 | 4/2015 | |
| JP | 2012-134277 A | 7/2012 | |
| JP | 2012-244403 A | 12/2012 | |
| JP | 2014-10294 A | 1/2014 | |
| KR | 1999-001317 A | 1/1999 | |
| KR | 10-2007-0122161 A | 12/2007 | |
| KR | 10-2009-0030932 A | 3/2009 | |
| KR | 10-2009-0130775 A | 12/2009 | |
| KR | 10-2012-0089294 A | 8/2012 | |
| KR | 10-2013-0093046 A | 8/2013 | |
| KR | 10-2015-0042123 A | 4/2015 | |
| KR | 10-2015-0049159 A | 5/2015 | |
| KR | 10-1516766 B1 | 5/2015 | |
| KR | 10-2015-0123204 A | 11/2015 | |
| WO | 2007001038 * | 6/2006 | ........... G02B 17/004 |

OTHER PUBLICATIONS

Chinese Search Report dated Aug. 25, 2021.
Chinese Search Report dated Sep. 16, 2021.
Korean Search Report dated Sep. 28, 2021.
Korean Search Report dated Mar. 9, 2021.
Korean Notice of Patent Grant dated Sep. 18, 2020.
Malaysian Search Report dated May 29, 2021.
Korean Search Report dated Jan. 10, 2022.
Chinese Search Report dated Dec. 16, 2021.
Indian Search Report dated Dec. 29, 2021.
Chinese Search Report dated Mar. 9, 2022.
Substantive Examination Clear Report dated Jun. 22, 2022.

* cited by examiner though glass materials are increasingly applied to exteriors of electronic devices due to their strong surface hardness and good optical performance, the unit cost of production is increasing because of the following problems. In addition, when glass is used as a part of materials for an exterior of an electronic device, there are problems that a high material price is a burden to a manufacturer, and the glass is fragile and has difficulty in molding.

METHOD FOR MANUFACTURING EXTERIOR HOUSING AND ELECTRONIC DEVICE COMPRISING SAME

This application is a Continuation of U.S. patent application Ser. No. 15/751,212, filed on Feb. 8, 2018 which is a continuation of PCT/KR2016/005547, which was filed on May 26, 2016, and claims a priority to Korean Patent Application No. 10-2015-0113076, which was filed on Aug. 11, 2015, the contents of which are incorporated herein by reference

TECHNICAL FIELD

Various embodiments of the present invention relate to an exterior housing of an electronic device, and more particularly, to an exterior surface mounting member which is formed of a transparent material and can be used for an exterior in replacement of glass.

BACKGROUND ART

With the enhancement of communication technology, electronic devices provided with various functions are appearing. Such electronic devices may have a convergence function of complexly performing one or more functions.

In recent years, as functional differentials among manufacturers of electronic devices have noticeably narrowed, there is an effort to increase rigidity of electronic devices which are becoming slimmer in order to meet consumers' desires to purchase, and to reinforce design aspects. Manufacturers of electronic devices are pursuing high quality of electronic devices and aesthetic exteriors of electronic devices by implementing at least a part of various structures (for example, an exterior) of electronic devices using glass materials or metallic materials according to various embodiments.

Various transparent materials are used for an electronic device to provide an aesthetic feeling on a display window of a front surface or a rear surface, or on the rear surface. In particular, glass materials are increasingly used in electronic devices due to their strong surface hardness and good optical performance.

DETAILED DESCRIPTION OF THE INVENTION

Technical Objects

Although glass materials are increasingly applied to exteriors of electronic devices due to their strong surface hardness and good optical performance, the unit cost of production is increasing because of the following problems. In addition, when glass is used as a part of materials for an exterior of an electronic device, there are problems that a high material price is a burden to a manufacturer, and the glass is fragile and has difficulty in molding.

Various embodiments of the present invention provide a method for manufacturing an exterior housing, which can substitute for a glass material, while having original characteristics of glass, and an electronic device including the same.

Various embodiments of the present invention provide a method for manufacturing an exterior housing which can perform three-dimensional (3D) molding using a mold, and an electronic device including the same.

In addition, various embodiments of the present invention provide a method for manufacturing an exterior housing which has a high surface hardness greater than or equal to 4 H, and an electronic device including the same.

In addition, various embodiments of the present invention provide a method for manufacturing an exterior housing, which can implement a design effect without a separate film, and an electronic device including the same.

Technical Solving Means

According to exemplary embodiments of the present invention, there is provided an electronic device including: an external housing comprising a first surface facing a first direction and a second surface facing a second direction opposite to the first direction; a display of which at least a part is exposed through the first surface; and a polymer plate which forms at least a part of the second surface of the housing, wherein the polymer plate includes: at least one opaque layer; at least one polymer layer which is translucent or transparent and is disposed on the at least one opaque layer; and a coating layer which is disposed on the at least one polymer layer and has a hardness greater than or equal to a selected hardness, wherein each of the at least one opaque layer, the at least one polymer layer, and the coating layer includes a first surface and a second surface which extends from the first surface so as to have at least a part thereof bent.

Advantageous Effect

According to various embodiments of the present invention, the exterior surface mounting member can be molded in a 3D shape using a planar polymer base which guarantees glass performance. When a bending force is less than or equal to 10R, a part or entirety of the exterior of the electronic device may be configured to have a circular shape.

According to various embodiments of the present invention, the exterior surface mounting member can be molded in a 3D shape with UV molding being applied to the rear surface of the polymer base.

According to various embodiments of the present invention, the exterior surface mounting member guarantees a high surface hardness greater than or equal to 4H. By guaranteeing the surface hardness greater than or equal to 4H and an anti-scratch property, the exterior has quality equal to that of glass.

According to various embodiments of the present invention, the exterior surface mounting member can implement a design without a separate film through thermal molding after applying printing/UV molding under the polymer base.

BEST MODE FOR EMBODYING THE INVENTION

Figure 1A:
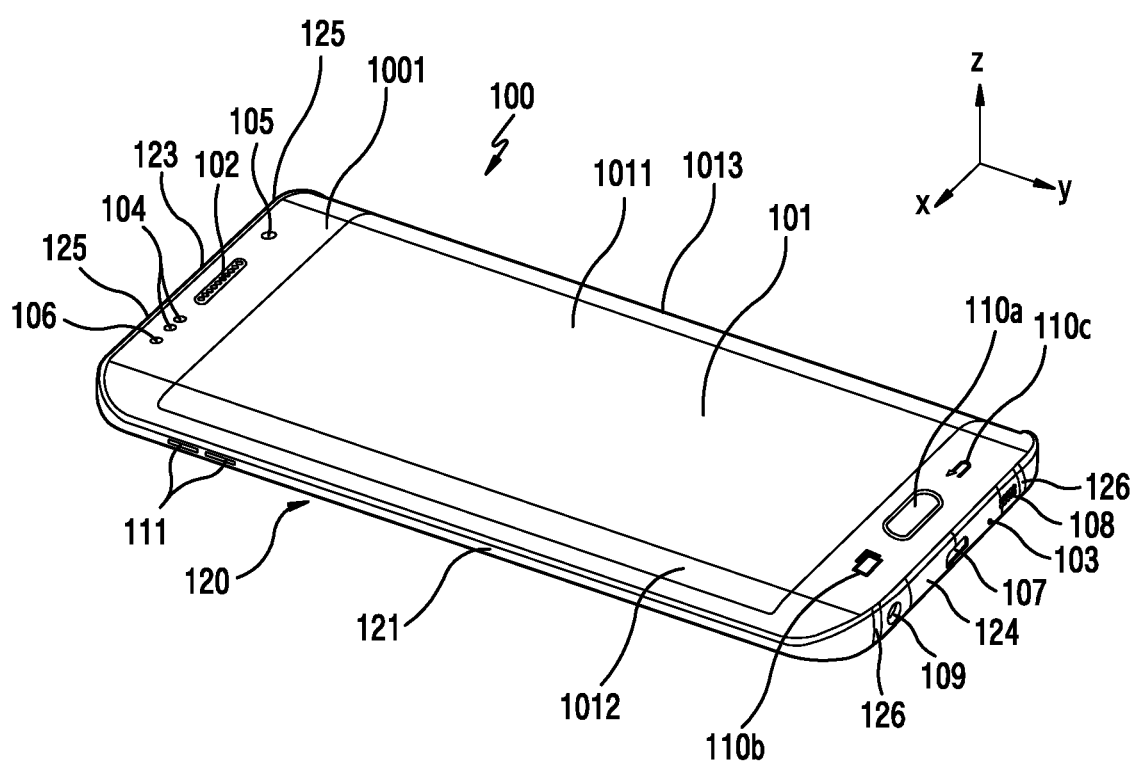
FIG. 1A is a perspective view showing a front surface portion of an electronic device according to various embodiments of the present invention.

Hereinafter, various embodiments of the present invention will be described with reference to accompanying drawings. However, various embodiments of the present invention are not limited to specific embodiments, and it should be understood that modification, equivalent, and/or alternative on the various embodiments described herein can be variously made. With regard to description of drawings, similar components may be marked by similar reference numerals.

In the disclosure disclosed herein, the expressions "have," "may have," "include" and "comprise," or "may include" and "may comprise" used herein indicate existence of corresponding features (for example, elements such as numeric values, functions, operations, or components) and do not preclude the presence of additional features.

In the disclosure disclosed herein, the expressions "A or B," "at least one of A or/and B," or "one or more of A or/and B," and the like used herein may include any and all combinations of one or more of the associated listed items. For example, the term "A or B," "at least one of A and B," or "at least one of A or B" may refer to all of the case (1) where at least one A is included, the case (2) where at least one B is included, or the case (3) where both of at least one A and at least one B are included.

The terms, such as "first," "second," and the like used herein, may refer to various elements of various embodiments of the present invention, but do not limit the elements. For example, such terms do not limit the order and/or priority of the elements. Furthermore, such terms may be used to distinguish one element from another element. For example, "a first user device" and "a second user device"

indicate different user devices regardless of the order or priority. For example, without departing from the scope of the present invention, a first element may be referred to as a second element, and similarly, a second element may be referred to as a first element.

It will be understood that when an element (for example, a first element) is referred to as being "(operatively or communicatively) coupled with/to" or "connected to" another element (for example, a second element), it can be directly coupled with/to or connected to another element or coupled with/to or connected to another element via an intervening element (for example, a third element). In contrast, when an element (for example, a first element) is referred to as being "directly coupled with/to" or "directly connected to" another element (for example, a second element), it should be understood that there is no intervening element (for example, a third element).

According to the situation, the expression "configured to (or set to)" used herein may be used as, for example, the expression "suitable for," "having the capacity to," "designed to," "adapted to," "made to," or "capable of". The term "configured to (or set to)" must not mean only "specifically designed to" in hardware. Instead, the expression "a device configured to" may mean that the device is "capable of" operating together with another device or other components. For example, a "processor configured to (or set to) perform A, B, and C" may mean a dedicated processor (for example, an embedded processor) for performing a corresponding operation or a generic-purpose processor (for example, a central processing unit (CPU) or an application processor) which may perform corresponding operations by executing one or more software programs which are stored in a memory device.

Terms used in the present invention are used to describe specified embodiments of the present invention and are not intended to limit the scope of other embodiments. The terms of a singular form may include plural forms unless otherwise specified. Unless otherwise defined herein, all the terms used herein, which include technical or scientific terms, may have the same meaning that is generally understood by a person skilled in the art. It will be further understood that terms, which are defined in a dictionary and commonly used, should also be interpreted as is customary in the relevant related art and not in an idealized or overly formal way, unless expressly so defined herein in various embodiments of the present invention. In some cases, even if terms are terms which are defined in the specification, they may not be interpreted to exclude embodiments of the present invention.

An electronic device according to various embodiments of the present disclosure may include at least one of smartphones, tablet personal computers (PCs), mobile phones, video telephones, electronic book readers, desktop PCs, laptop PCs, netbook computers, workstations, servers, personal digital assistants (PDAs), portable multimedia players (PMPs), Motion Picture Experts Group (MPEG-1 or MPEG-2) Audio Layer 3 (MP3) players, mobile medical devices, cameras, or wearable devices (for example, smart glasses, head-mounted-devices (HMDs), electronic apparels, electronic bracelets, electronic necklaces, electronic appcessory, electronic tattoos, smart mirrors, or smart watches).

According to certain embodiments, the electronic devices may be smart home appliances. The smart home appliances may include at least one of, for example, televisions (TVs), digital video disk (DVD) players, audios, refrigerators, air conditioners, cleaners, ovens, microwave ovens, washing machines, air cleaners, set-top boxes, home automation control panels, security control panels, TV boxes (for example, Samsung HomeSync™ Apple TV™, or Google TV™), game consoles (for example, Xbox™ and PlayStation™), electronic dictionaries, electronic keys, camcorders, electronic picture frames, and the like.

According to another embodiment, the electronic devices may include at least one of medical devices (for example, various portable medical measurement devices (for example, a blood glucose monitoring device, a heartbeat measuring device, a blood pressure measuring device, a body temperature measuring device, and the like), a magnetic resonance angiography (MRA), a magnetic resonance imaging (MRI), a computed tomography (CT), scanners, and ultrasonic devices), navigation electronic devices, global positioning system receivers (GPSs), event data recorders (EDRs), flight data recorders (FDRs), vehicle infotainment devices, electronic equipment for vessels (for example, navigation systems and gyrocompasses), avionics, security devices, head units for vehicles, industrial or home robots, automatic teller's machines (ATMs) of financial institutions, points of sales (POSs) of stores, or internet of things (for example, light bulbs, various sensors, electric or gas meters, sprinkler devices, fire alarms, thermostats, street lamps, toasters, exercise equipment, hot water tanks, heaters, boilers, and the like).

Figure 1B:
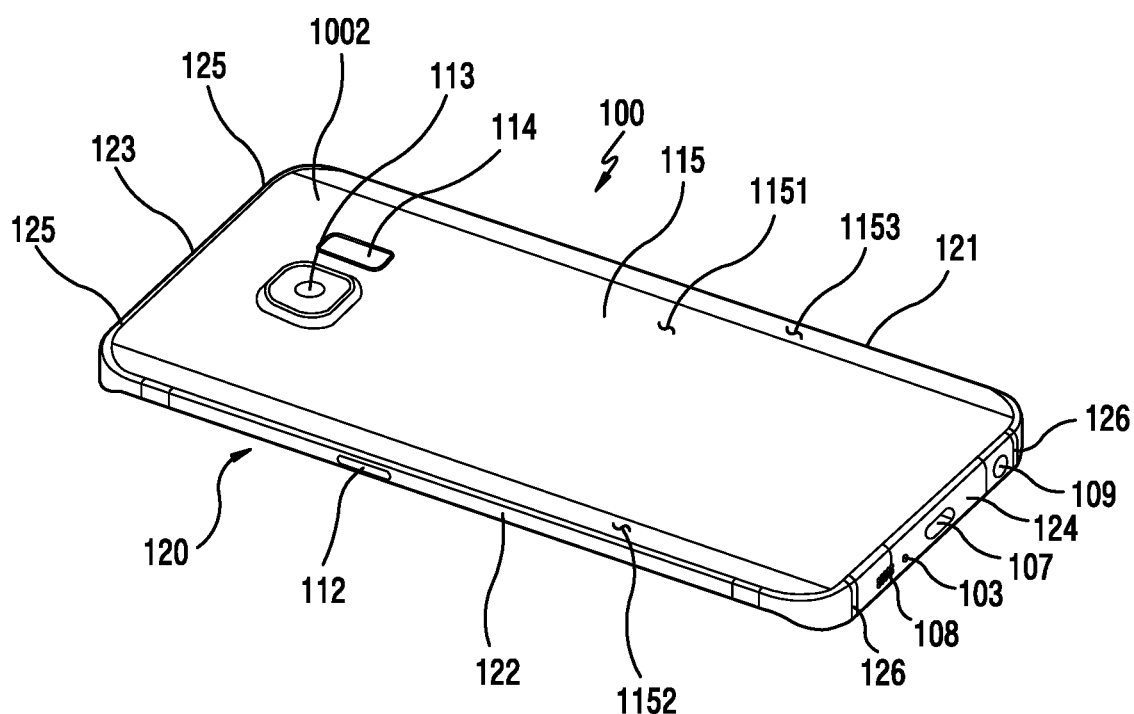
FIG. 1B is a perspective view showing a rear surface portion of the electronic device according to various embodiments of the present invention.
Figure 2:
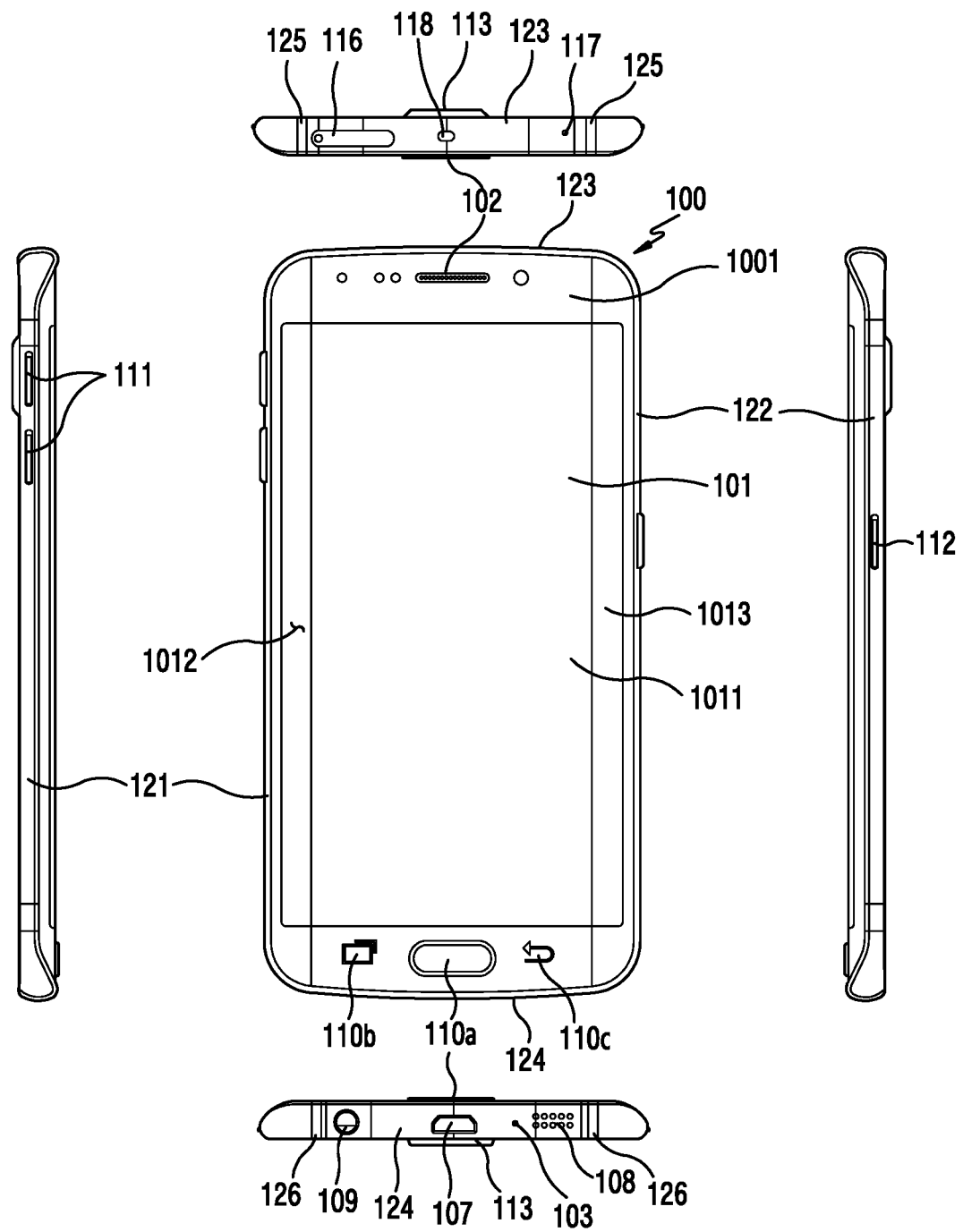
FIG. 2 is a view showing the electronic device as viewed from the top, bottom, left, and right according to various embodiments of the present invention.

According to a certain embodiment, the electronic devices may include at least one of a part of furniture or buildings/structures, electronic boards, electronic signature receiving devices, projectors, or various measuring instruments (for example, water meters, electricity meters, gas meters, or wave meters, and the like). The electronic devices according to various embodiments may be one or more combinations of the above-mentioned devices. According to a certain embodiment, an electronic device may be a flexible electronic device. Also, electronic devices according to various embodiments of the present disclosure are not limited to the above-mentioned devices, and may include new electronic devices according to technology development FIG. 1A is a perspective view showing a front surface portion of an electronic device according to various embodiments of the present invention. FIG. 1B is a perspective view showing a rear surface portion of the electronic device according to various embodiments of the present invention. FIG. 2 is a view showing the electronic device as viewed from the top, bottom, left, and right according to various embodiments of the present invention.

Referring to FIGS. 1A to 2, the electronic device 100 according to various embodiments may have a display 101 (or referred to as a touch screen) installed on the front surface portion thereof. A receiver 102 may be disposed on an upper side of the display 101 to receive a voice of the other person. A microphone 103 may be disposed on a lower side of the display 101 to transmit a voice of a user of the electronic device to the other person.

Components for performing various functions of the electronic device 100 may be arranged on the periphery of the receiver 102. The components may include at least one sensor module 104. The sensor module 104 may include at least one of, for example, an illuminance sensor (for example, a light sensor), a proximity sensor (for example, a light sensor), an infrared sensor, and an ultrasonic sensor. According to one embodiment, the components may include a front surface camera 105. According to one embodiment, the components may include an indicator 106 to inform the user of state information of the electronic device 100.

The display 101 may be formed to be large enough to occupy most of the front surface of the electronic device 100. A main home screen may be the first screen that is displayed on the display 101 when power of the electronic device 100 is turned on. In addition, when the electronic device 100 has different home screens of numerous pages, the main home screen may be the first one of the home screens of the numerous pages. The home screen may display shortcut icons for executing frequently used applications, a main menu toggle key, time, weather, or the like. The main menu toggle key displays a menu screen on the display 101. In addition, a state bar indicating the state of the electronic device 100, such as a battery charging state, an intensity of a received signal, a current time, may be formed on the upper end of the display 101. A home key 110a, a menu key 110b, and a back key 110c may be formed on the lower portion of the display 101.

The home key 110a displays the main home screen on the display 101. For example, when the home key 110a is touched in a state in which a home screen different from the main home screen or the menu screen is displayed on the display 101, the main home screen may be displayed on the display 101. In addition, when the home key 110a is touched while applications are being executed on the display 101, the main home screen may be displayed on the display 101. In addition, the home key 110a may be used to display recently used applications on the display 101 or to display a task manager.

The menu key 110b provides a link menu that can be used on the display 101. The link menu may include a widget add menu, a background screen change menu, a search menu, an edit menu, an environment setting menu, or the like. The back key 110c may display a screen that was executed right before a currently executed screen or may terminate the most recently used application.

According to various embodiments, the electronic device 100 may include a metal frame 120 as a metal housing. The metal frame 120 may be disposed along the border of the electronic device 100, and may be disposed to extend to at least a part of the rear surface extending from the border of the electronic device. The metal frame 120 may define at least a part of a thickness of the electronic device 100 along the border of the electronic device, and may be formed in a closed loop shape. However, this should not be considered as limiting, and the metal frame 120 may be formed in such a manner that it contributes to at least a part of the thickness of the electronic device 100.

The metal frame 120 may be disposed only on at least a part of the border of the electronic device 100. When the metal frame 120 contributes to a part of the housing of the electronic device 100, the other part of the housing may be substituted with a nonmetallic member. In this case, the housing may be formed by injection molding by inserting the nonmetallic member into the metal frame 120. The metal frame 120 may include at least one segmentation portion 125, 126, and a unit metal frame divided by the segmentation portion 125, 126 may be utilized as an antenna emitter. An upper frame 123 may contribute to a unit frame by a pair of segmentation portions 125 formed at a regular interval. A lower frame 124 may contribute to a unit frame by a pair of segmentation portions 126 formed at a regular interval. The segmentation portions 125, 126 may be formed when the nonmetallic member is inserted into the metal member and is injection molded.

The metal frame 120 may have a closed loop shape along the border, and may be disposed in such a manner that it contributes to the overall thickness of the electronic device 100. When the electronic device 100 is viewed from the front side, the metal frame 120 may include a left frame 121, a right frame 122, the upper frame 123, and the lower frame 124.

Various electronic components may be arranged in the lower frame 124 of the electronic device. A speaker 108 may be disposed at one side of the microphone 103. An interface connector 107 may be disposed at the other side of the microphone 103 to perform a data exchanging function with an external device and to receive external power and charge the electronic device 100. An ear jack hole 109 may be disposed at one side of the interface connector 107. The above-described microphone 103, speaker 108, interface connector 107, and ear jack hole 109 may be all arranged in a region of the unit frame formed by the pair of segmentation portions 126 disposed on the lower frame 124. However, this should not be considered as limiting, and at least one of the above-described electronic components may be disposed in a region including the segmentation portion 126 or may be disposed outside the unit frame.

Referring to FIG. 2, various electronic components may be arranged in the upper frame 123 of the electronic device 100. A socket device 116 may be disposed in the upper frame 123 to allow a card type external device to be inserted thereinto. The socket device 116 may accommodate at least one of an unique ID card (for example, a subscriber identify module (SLM) card, a user identification module (UM) card, or the like) for the electronic device, and a memory card for extending a storage space. An infrared sensor module 118 may be disposed at one side of the socket device 116, and an auxiliary microphone device 117 may be disposed at one side of the infrared sensor module 118. The socket device 116, the infrared sensor module 118, and the auxiliary microphone device 117 may be all arranged in a region of the unit frame formed by the pair of segmentation portions 125 formed on the upper frame 123. However, this should not be considered as limiting, and at least one of the above-described electronic components may be disposed in a region including the segmentation portions 225 or may be disposed outside the segmentation portions.

At least one first side key button 111 may be disposed on the left frame 121 of the metal frame 120. The at least one first side key button 111 may be provided on the left frame 121 in pair and may be disposed to have a part thereof protrude from the left frame 121, and may contribute to perform a volume up/down function, a scroll function, or the like. At least one second side key button 112 may be disposed on the right frame 122 of the metal frame 120. The second side key button 112 may contribute to perform a power on/off function, a wake up/sleep function of the electronic device, or the like. At least one key button 110 may be disposed on at least a part of the lower region of the front surface 110 of the electronic device 100 except for the display. The key button 110 may perform a home key button function. A fingerprint recognition sensor device may be disposed on a top surface of the home key button. The home key button may contribute to perform a first function (a home screen returning function, a wake up/sleep function, or the like) by a physically pressing operation, and to perform a second function (for example, a fingerprint recognition function or the like) by a swiping operation on the top surface of the home key button. Although not shown, a touch pad may be disposed on the left and the right of the key button 110 to perform a touch function.

A rear surface camera 113 may be disposed on a rear surface 1002 of the electronic device 100, and at least one electronic component 114 may be disposed at one side of the rear surface camera 113. The electronic component 114 may include at least one of an illuminance sensor (for example, a light sensor), a proximity sensor (for example, a light sensor), an infrared sensor, an ultrasonic sensor, a heartbeat sensor, and a flash device.

A front surface 1001 including the display 101 may include a flat surface portion 1011 and a left curved surface portion 1012 and a right curved surface portion 1013 formed on the left and right sides of the flat surface portion 1011, respectively. The front surface 1001 of the electronic device 100 may include both the display region 101 and the other region (for example, a BM region) using one window. The left and right curved surface portions 1012, 1013 may be formed by extending from the flat surface portion 1011 in the X-axis direction of the electronic device 100. The left and right curved surface portions 1012, 1013 may contribute to a part of the side surface of the electronic device 100. In this case, the left and right curved surface portions 1012, 1013 and the left and right frames 121, 122 of the metal frame 120 may contribute to the side surface of the electronic device 100. However, this should not be considered as limiting, and the front surface 1001 of the display 101 may include only at least one of the left and right curved surface portions 1012, 1013. The front surface 1001 may be configured to include only the left curved surface portion 1012 along the flat surface portion 1011, or to include only the right curved surface portion 1013 along the flat surface portion 1011.

The front surface 1001 may include a window 130 (shown in FIG. 3) including the curved surface portions 1012, 1013 formed on the left and right thereof, and a flexible display module applied to at least a part of the lower side of the window. The region including the flexible display module may contribute to the display 101. According to one embodiment, the window 130 (shown in FIG. 3) may be formed in such a method that its top surface and rear surface are bent simultaneously (hereinafter, referred to as a "3D method"). However, this should not be considered as limiting, and the window 130 (shown in FIG. 3) may be formed in such a method that left and right portions of the top surface are curved and the rear surface is flat (hereinafter, referred to as a "2.5D method"). The window may be formed of a transparent glass material (for example, sapphire glass) or a transparent synthetic resin material.

The electronic device 100 may control the display module to selectively display information. The electronic device 100 may control the display module to configure a screen only on the flat surface portion 1011. The electronic device 100 may control the display module to configure a screen including any one of the left and right curved surface portions 1012, 1013 with the flat surface portion 1011. The electronic device 100 may control the display module to configure a screen only with at least one of the left and right curved surface portions 1012, 1013 except for the flat surface portion 1011.

The rear surface 1002 of the electronic device 100 may also be entirely formed by one rear surface exterior surface mounting member 115. The rear surface 1002 may include a flat surface portion 1151 formed with reference to a substantially center thereof, and a left curved surface portion 1152 and a right curved surface portion 1153 formed on the left and right of the flat surface portion 1151, respectively. A window 115 may be formed in a 2.5D method such that the left and right curved surface portions 1152, 1153 of the outer surface of the window 115 are curved and the rear surface is flat. However, this should not be considered as limiting, and the window 115 may be formed in the 3D method like the window disposed on the front surface 1001. The left and right curved surface portions 1152, 1153 may contribute to a part of the side surface of the electronic device 100. In this case, the left and right curved surface portions 1152, 1153 and the left and right frames 121, 122 of the metal frame 120 may contribute to the side surface of the electronic device 100. However, this should not be considered as limiting, and the rear surface 1002 may include only at least one of the left and right curved surface portions 1152, 1153. The rear surface 1102 may be configured to include only the left curved surface portions 1152 along the flat surface portion 1151, or to include only the right curved surface portion 1153 along the flat surface portion 1151.

Left and right corners of the upper side of the front surface 1001 and left and right corners of the lower side may be formed to be inclined in the X-axis direction, the Y-axis direction, and the Z-axis direction, simultaneously, while the window is bent. Due to this shape, left and right corners of the upper side of the metal frame 120 and left and right corners of the lower side may be formed to have the height of the side surface of the metal frame 120 gradually reduced.

Figure 3:
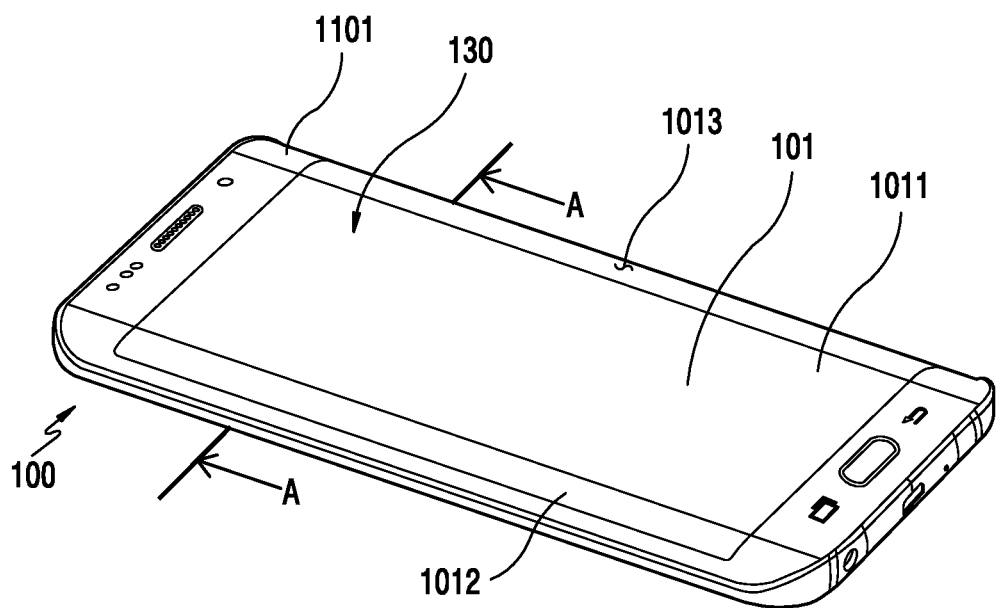
FIG. 3 is a perspective view showing a front surface window (front surface exterior surface mounting member) of the electronic device according to various embodiments of the present invention.

FIG. 3 is a perspective view showing a front surface window (front surface exterior surface mounting member) of the electronic device according to various embodiments of the present disclosure.

Referring to FIG. 3, according to various embodiments, the electronic device 100 may have the transparent window 130 formed on the front surface 1101 thereof. The front surface 1101 may include the display 101 region. The window 130 formed on the front surface may include the flat surface portion 1011, and the left bending portion (curved surface portion) 1012 and the right bending portion (curved surface portion) 1013 which are formed by bending the left and right regions of the flat surface portion 1011 (curved shape).

Figure 4:
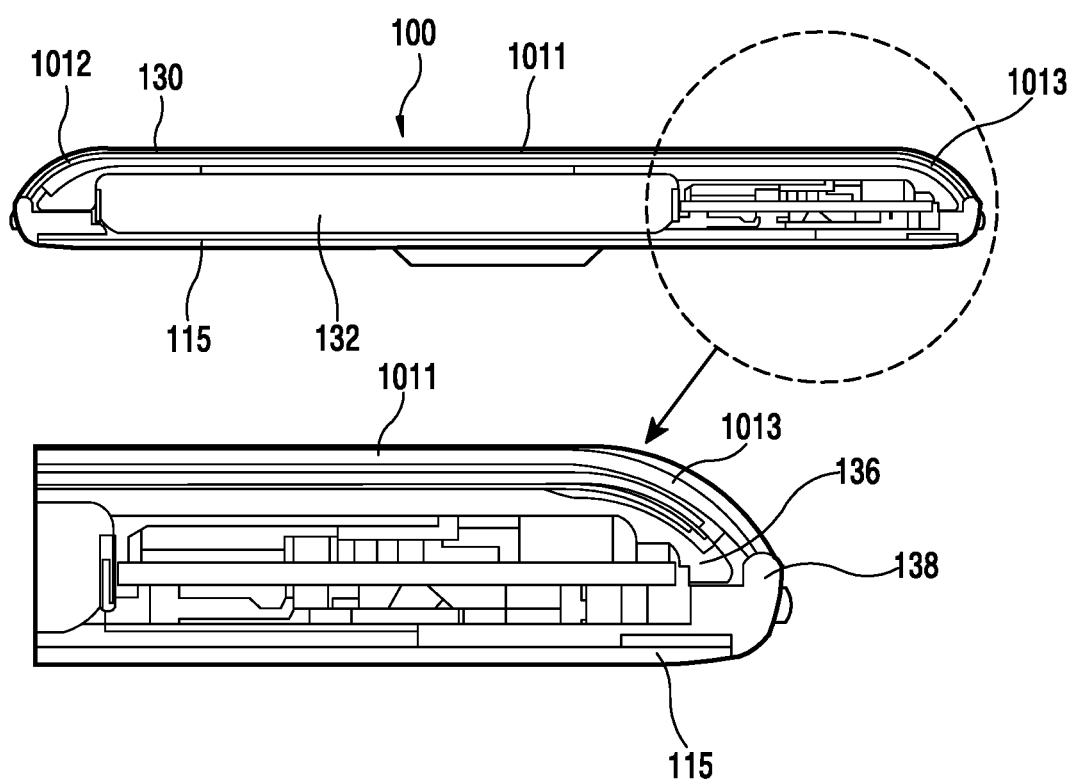
FIG. 4 is a view enlarging a part of the electronic device as a cross sectional view taken on line A-A of FIG. 3.

FIG. 4 is a view enlarging a part of the electronic device as a cross sectional view taken on line A-A of FIG. 3.

Referring to FIG. 4, the electronic device 100 may include a support structure for supporting a substrate and a display, for example, a bracket 136. The bracket 136 may be fixed to the housing. The display may be fixed to a front surface of the bracket 136, and the front surface window 130 may be disposed on an upper portion of the bracket 136. The front surface window 130 may be fixed by being attached to the bracket 136 by a first adhering member. The front surface window 130 may be fixed by being attached to the bracket 136 by the first adhering member according to a shape of an end portion of the housing. The front surface window 130 may be formed to have a uniform thickness and a predetermined curvature. According to one embodiment, the front surface window 130 may include the flat surface portion 1011 and the left and right curved surface portions 1012, 1013 which are all formed to have predetermined thicknesses.

The rear surface window 115 (this term may be interchangeably used with a "rear surface mounting member") mounted on the rear surface of the electronic device may also be fixed to the housing by a second adhering member. The rear surface window 115 may be formed in such a shape that its thickness becomes thinner toward the left and right edges (2.5 D method). Reference numeral 132 may indicate a battery pack and reference numeral 138 may indicate a rear case. The rear surface window 115 may include a flat surface.

According to various embodiments of the present disclosure, the rear surface window 115 (high-hardness sheet) may be attached to the rear case 138. The rear case 138 may have one surface having a similar curvature to that of the rear surface window 115 (high-hardness sheet), and may further include an adhesion layer formed on at least a part of the one surface. The adhesion layer may fix and attach the rear surface window 115 to the rear case 136. According to various embodiments of the present disclosure, the rear surface window 115 (high-hardness sheet) may further include an antenna module (not shown) formed on a rear surface thereof. The antenna module may be near field communication (NFC), a wireless charging antenna, or magnetic secure transmission (MST). The rear surface window 115 may further include a penetrating hole 115a (shown in FIG. 5) for assembling with peripheral components such as a camera, a heart rate monitor (HRM) sensor, a flash, or the like.

Figure 5:
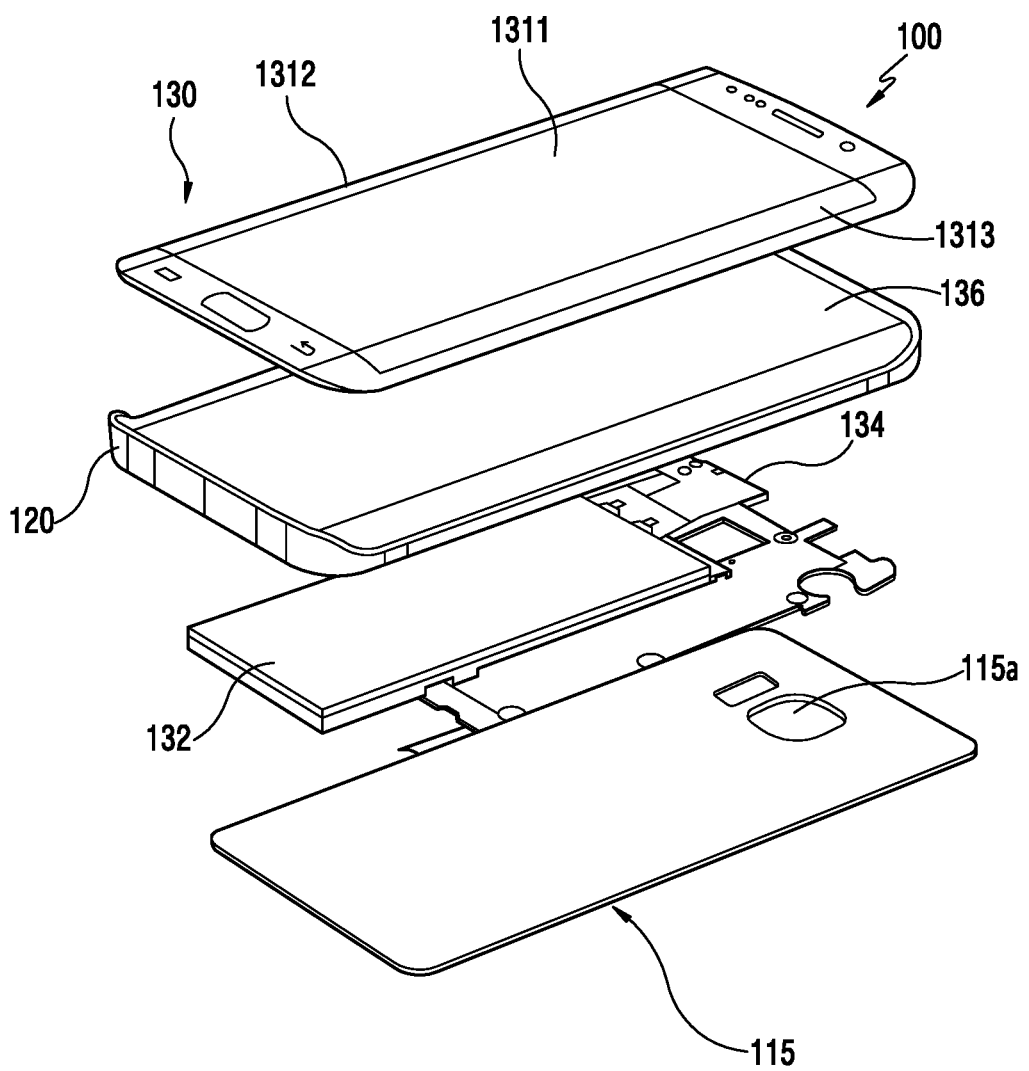
FIG. 5 is an exploded perspective view of the electronic device according to various embodiments of the present invention.

FIG. 5 is an exploded perspective view showing the electronic device according to various embodiments of the present disclosure.

Referring to FIG. 5, the electronic device 100 may have the front surface window 130, for example, a transparent front surface exterior surface mounting member, stacked on the upper side with reference to the housing surrounded by the metal frame 120. The rear surface window 115, for example, a rear surface exterior surface mounting member, may be stacked on the lower side with reference to the housing. In addition, the battery pack 132 and a printed circuit board assembly (PCBA) 134 may be accommodated in the housing. The front surface window 130 and the rear surface window 115 may be opposite each other with reference to the housing. The front surface window 130 or the rear surface window 115 may be a part of the exterior surface mounting member.

The front surface window 130 may be formed of a transparent material and may be referred to as a window or a display window. The front surface window 130 may include a flat surface portion 1311, and a left curved surface portion 1312 and a right curved surface portion 1312 which extend from the flat surface portion 131 in opposite directions. The left curved surface portion 1312 and the right curved surface portion 1312 may have first and second curvatures, respectively. The first and second curvatures may be the same as each other or different from each other. The front surface window 130 may be positioned on the exterior of the electronic device 100 to form the front surface, may use a transparent material to display a screen displayed on the display, and may provide an input and output window of various sensors. Although FIG. 5 depicts that the left and right curved surface portions 1312, 1313 are formed in the 3D method, a single refraction shape may be applied to the upper and lower sides as well as the left and right sides, or a double refraction shape may be applied to the upper, lower, left, and right sides. This will be described below with reference to FIGS. 12A to 13B.

The housing may form the exterior (for example, the side surface including the metal frame 120) of the electronic device, and may make an inner space by being coupled to the bracket 136. The front surface window 130 may be disposed on the front surface of the housing, and the rear surface window 115 may be disposed on the rear surface of the housing.

The above-mentioned front surface and/or rear surface window 130, 115 is a member which serves as at least a part of the exterior of the electronic device 100, and may be at least a part of the front surface portion of the electronic device, at least a part of the rear surface portion, or at least a part of the side surface portion. When the window is disposed on the front surface portion of the electronic device, the exterior surface mounting member may be referred to as a front surface cover, for example, a (front surface) window, and, when the window is disposed on the rear surface portion of the electronic device, the exterior surface mounting member may be referred to as a back cover or a rear surface cover, or a (rear surface) window. The exterior surface mounting member disposed on the rear surface portion may be integrated into the electronic device or may be configured to be attachable to or detachable from the electronic device. In addition, the front surface window 130 may include a transparent member and the rear surface window 115 may include a transparent or translucent exterior surface mounting member.

Figure 6:
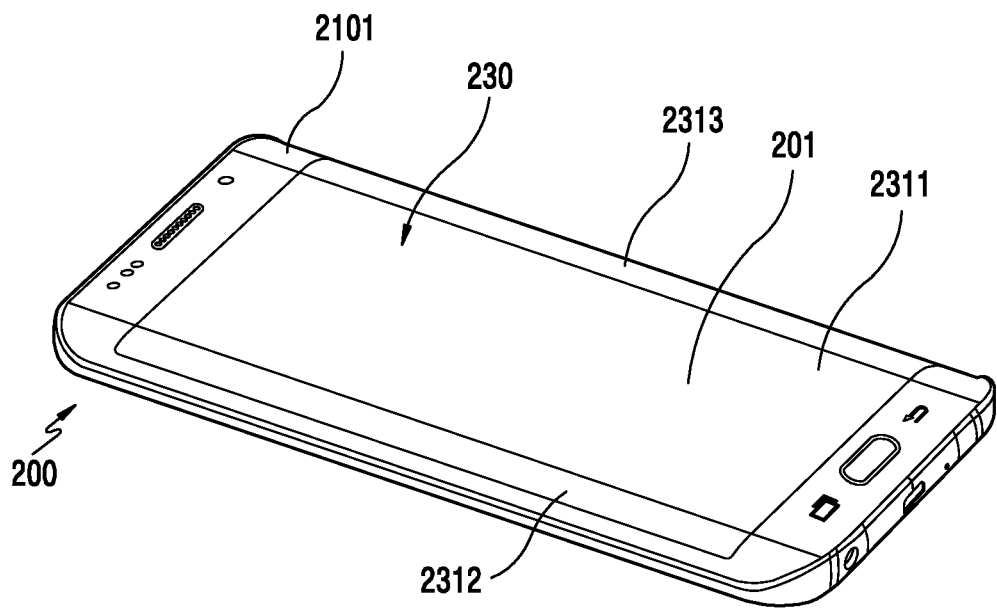
FIG. 6 is a perspective view showing a front surface window (front surface exterior surface mounting member) of an electronic device according to various embodiments of the present invention.
Figure 7:
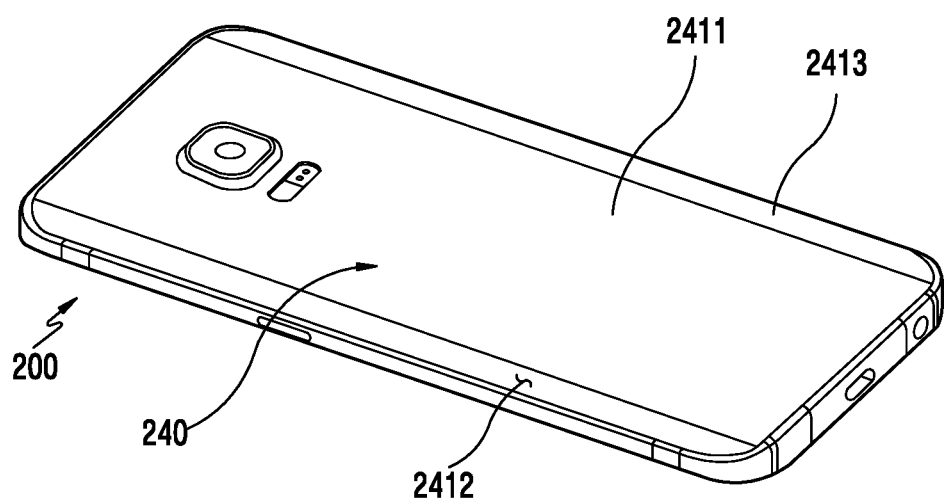
FIG. 7 is a perspective view showing a rear surface window (rear surface exterior surface mounting member) of the electronic device according to various embodiments of the present invention.
Figure 8:
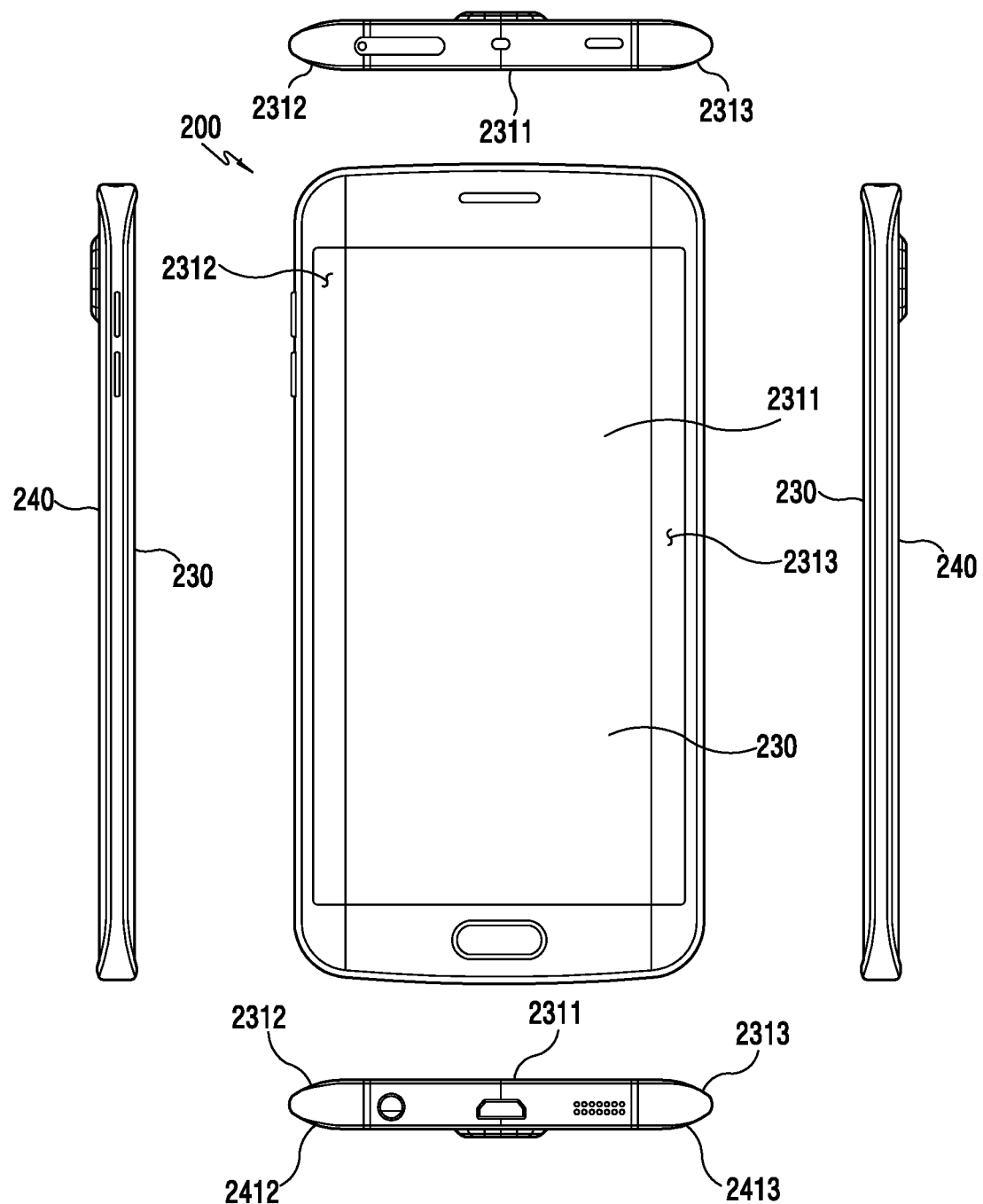
FIG. 8 is a view showing the electronic device as viewed from the top, bottom, left, and right according to various embodiments of the present invention.

FIG. 6 is a perspective view showing a front surface of an electronic device according to various embodiments of the present invention. FIG. 7 is a perspective view showing a rear surface of the electronic device according to various embodiments of the present invention. FIG. 8 is a view showing the electronic device as viewed in various directions according to various embodiments of the present invention.

The configuration shown in FIGS. 6 to 8 is substantially similar to the configuration shown in FIGS. 1A to 2, and is different therefrom in a front surface window and a rear surface window. Therefore, a redundant explanation of technical features will be omitted.

Referring to FIG. 6, the electronic device 200 according to various embodiments may have a front surface portion 2101 formed of a transparent window. A front surface window 230 may be disposed on the front surface portion. According to one embodiment, the front surface 2101 may include a display region 201. The front surface window 230 may include a flat surface portion 2311, and a left curved surface portion 2312 and a right curved surface portion 2311 which are formed by bending the left and right regions of the flat surface portion 2311. The left curved surface portion 2312 and the right curved surface portion 2313 may have first and second curvatures, respectively. The first and second curvatures may be the same as each other or different from each other.

According to various embodiments, a transparent window may be formed on a rear surface portion of the electronic device 200. A rear surface window 240 may be disposed on the rear surface portion. The rear surface window 240 may include a flat surface portion 2411, and a left curved surface portion 2412 and a right curved surface portion 2413 which are formed by bending the left and right regions of the flat surface portion 2411. The left curved surface portion 2412 and the right curved surface portion 2412 may have first and second curvatures, respectively. The first and second curvatures may be the same as each other or different from each other.

In addition, according to various embodiments, the left and right curved surface portions 2312, 2313 of the front surface window 230 and the left and right curved surface portions 2412, 2413 of the rear surface window 240 may be formed to have the same degree of bending. However, this should not be considered as limiting, and at least one of the left and right bending portions 2312, 2313 of the front surface window and the left and right bending portions 2412, 2413 of the rear surface window may be formed to have a different degree of bending. According to one embodiment, the front surface and rear surface windows 230, 240 may be formed in the above-described 3D method or 2.5 D method.

Figure 9:
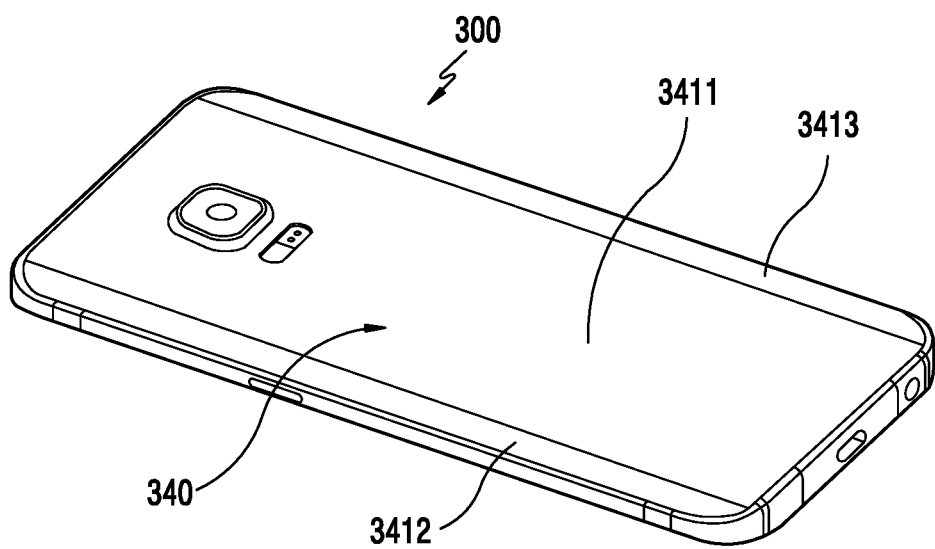
FIG. 9 is a perspective view showing a rear surface window (rear surface exterior surface mounting member) of an electronic device according to various embodiments of the present invention.
Figure 10:
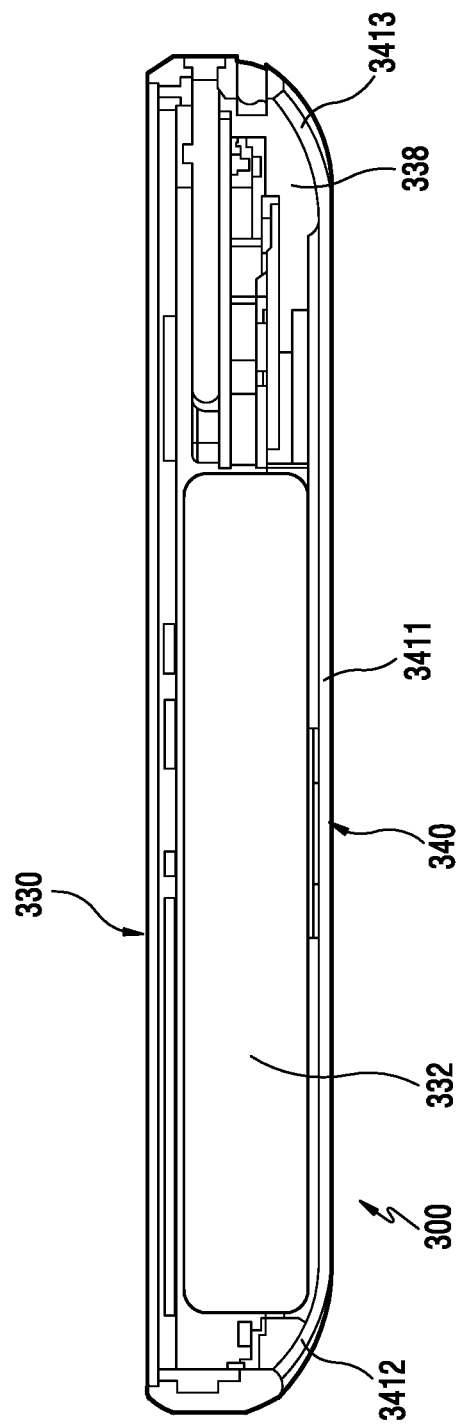
FIG. 10 is a cross sectional view of the electronic device shown in FIG. 9.
Figure 11:
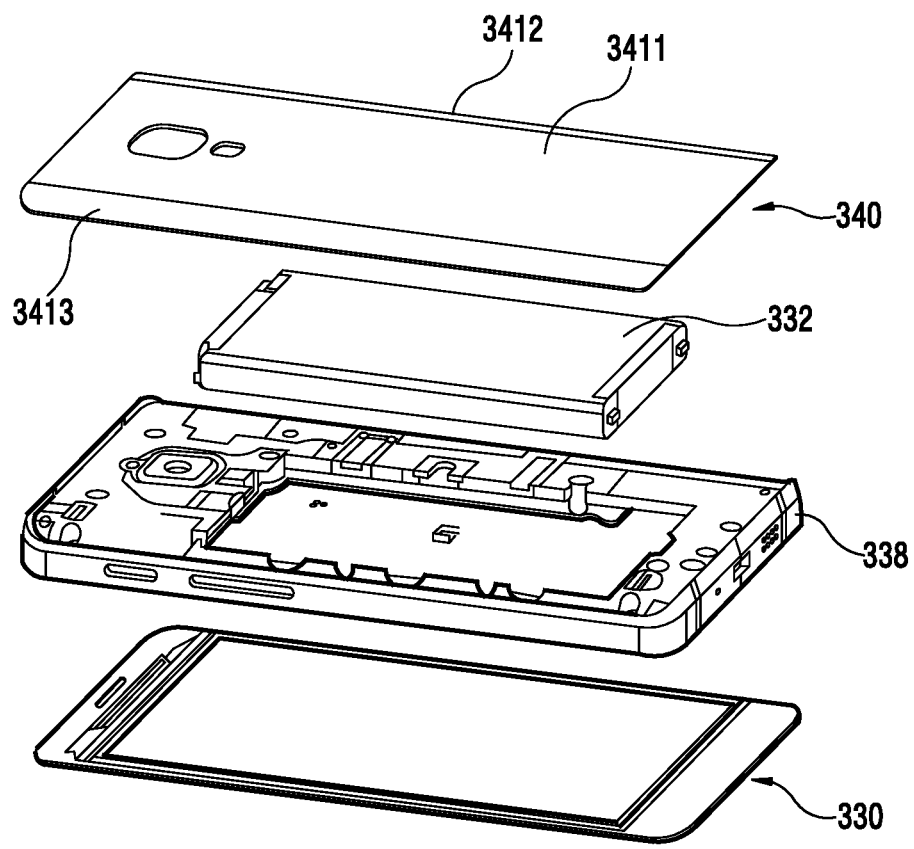
FIG. 11 is an exploded perspective view of the electronic device according to various embodiments of the present invention.

FIG. 9 is a perspective view showing a rear surface window (a rear surface exterior surface mounting member) of an electronic device according to various embodiments of the present invention. FIG. 10 is a cross sectional view of the electronic device shown in FIG. 9. FIG. 11 is an exploded perspective view of the electronic device according to various embodiments of the present invention.

Referring to FIGS. 9 to 11, the electronic device 300 according to various embodiments may have a transparent front surface window 330 disposed on a front surface thereof. The front surface window 330 may have a planar surface.

According to various embodiments, a rear surface of the electronic device 300 may be formed of a transparent/translucent window. A rear surface window 340 may be disposed on the rear surface portion. The rear surface window 340 may include a flat surface portion 3411, and a left curved surface portion 3412 and a right curved surface portion 3413 which are formed by bending the left and right regions of the flat surface portion 3411. The left curved surface portion 3412 and the right curved surface portion 3413 may have first and second curvatures, respectively. The first and second curvatures may be the same as each other or different from each other.

In addition, according to various embodiments, the left and right curved surface portions 3412, 3413 of the rear surface window 340 may be formed to have the same degree of bending. However, this should not be considered as limiting, and at least one of the left and right bending portions 3412, 3413 of the rear surface window may be formed to have a different degree of bending. According to one embodiment, the front surface and rear surface windows 330, 340 may be formed in the above-described 3D method or 2.5 D method.

According to various embodiments, the electronic device 300 may have the front surface window 330 disposed on a first surface of a rear case 338 to which a bracket is coupled to support a substrate assembly, and may have the rear surface window 340 disposed on a second surface of the rear case 338 opposite to the first surface. The front surface window 330 and the rear surface window 340 may face each other, may be opposite each other, or may be parallel to each other. The front surface window 330 may be formed of a transparent member and the rear surface window 340 may be transparent or translucent.

Reference numeral 332 may indicate a battery pack.

Figure 12A:
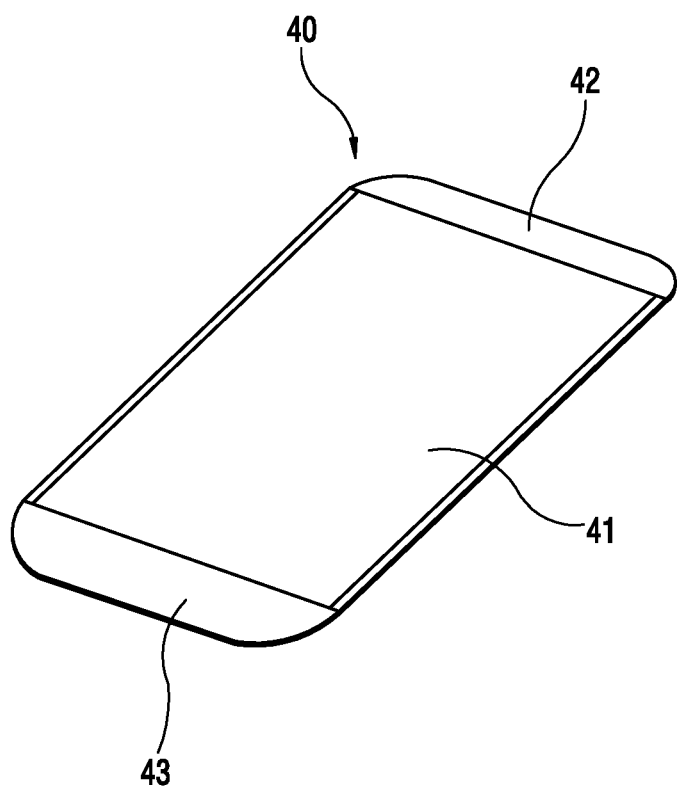
FIG. 12A is a perspective view showing a window which is mounted on a front surface or rear surface of an electronic device or on the front and rear surfaces of the electronic device according to various embodiments of the present invention.
Figure 12B:
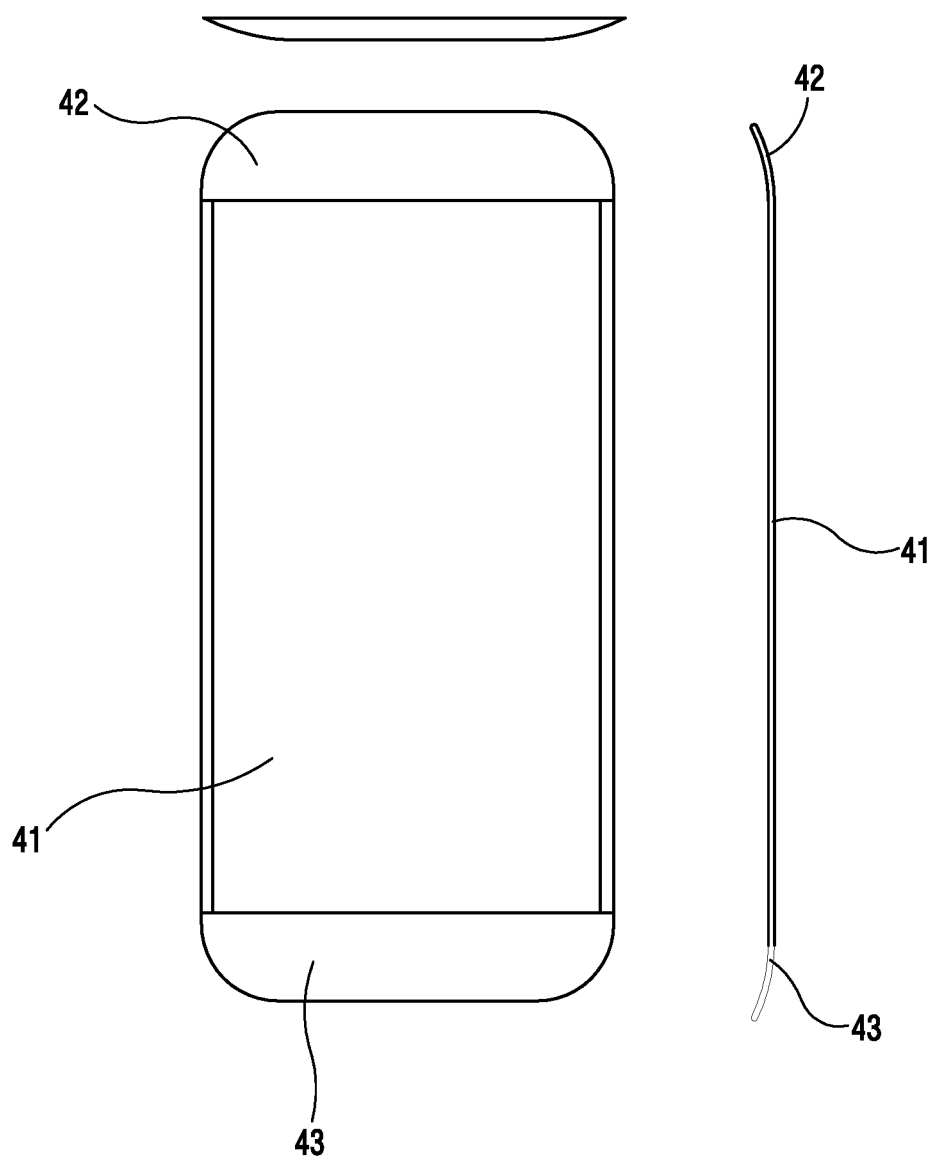
FIG. 12B is view showing the window which is mounted on the front surface or rear surface of the electronic device or on the front and rear surfaces of the electronic device, as viewed from the front side, upper side, and side, according to various embodiments of the present invention.

FIGS. 12A and 12B are perspective views showing various shapes of a window 40 applied to an electronic device according to various embodiments of the present invention. The window 40 may be disposed on a front surface or a rear surface or on the front and rear surfaces of the electronic device.

FIG. 12A is a perspective view showing the window which is mounted on the front surface or the rear surface, or on the front and rear surfaces of the electronic device according to various embodiments of the present invention. FIG. 12B is a view showing the window which is mounted on the front surface or the rear surface or on the front and rear surfaces of the electronic device, as viewed from the front, top, and side, according to various embodiments of the present invention.

As shown in FIGS. 12A and 12B, the window 40 may include a flat surface region 41 formed with reference to a display region, and curved surface portions which are formed by bending an upper region 32 formed on an upper portion of the flat surface region 41 and a lower region 43 formed on a lower portion of the flat surface region 41. In this case, a corresponding display module may be disposed in a corresponding shape.

Figure 13A:
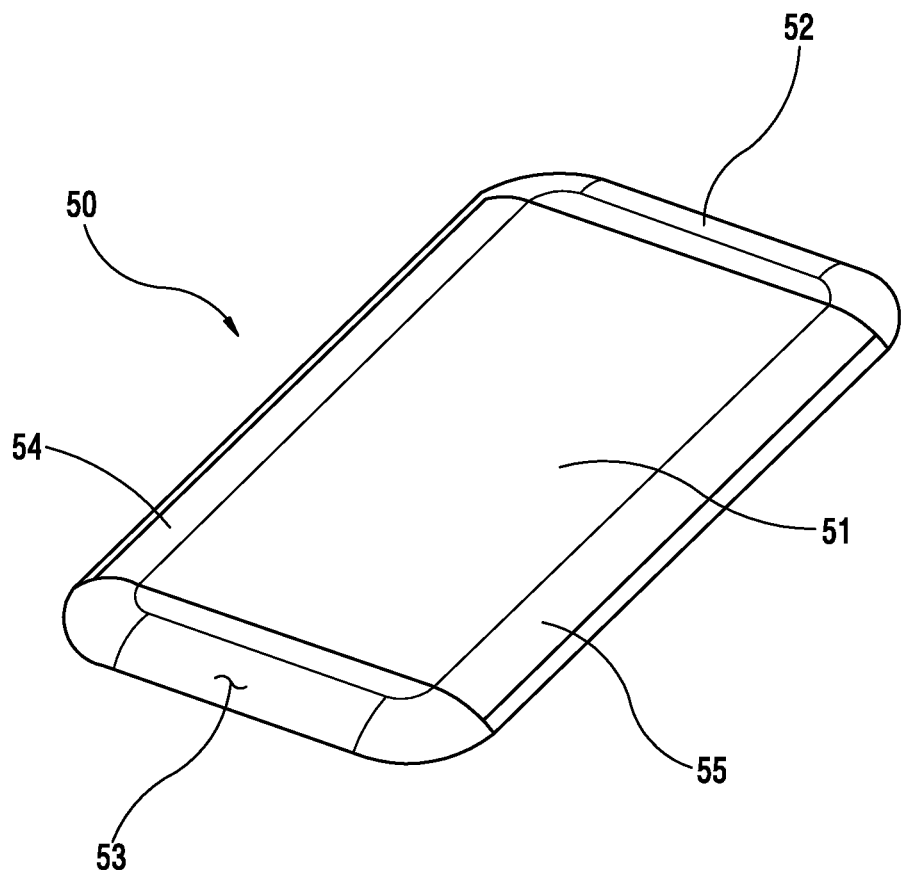
FIG. 13A is a perspective view showing a window which is mounted on a front surface or rear surface of the electronic device or on the front and rear surfaces of the electronic device according to various embodiments of the present invention.
Figure 13B:
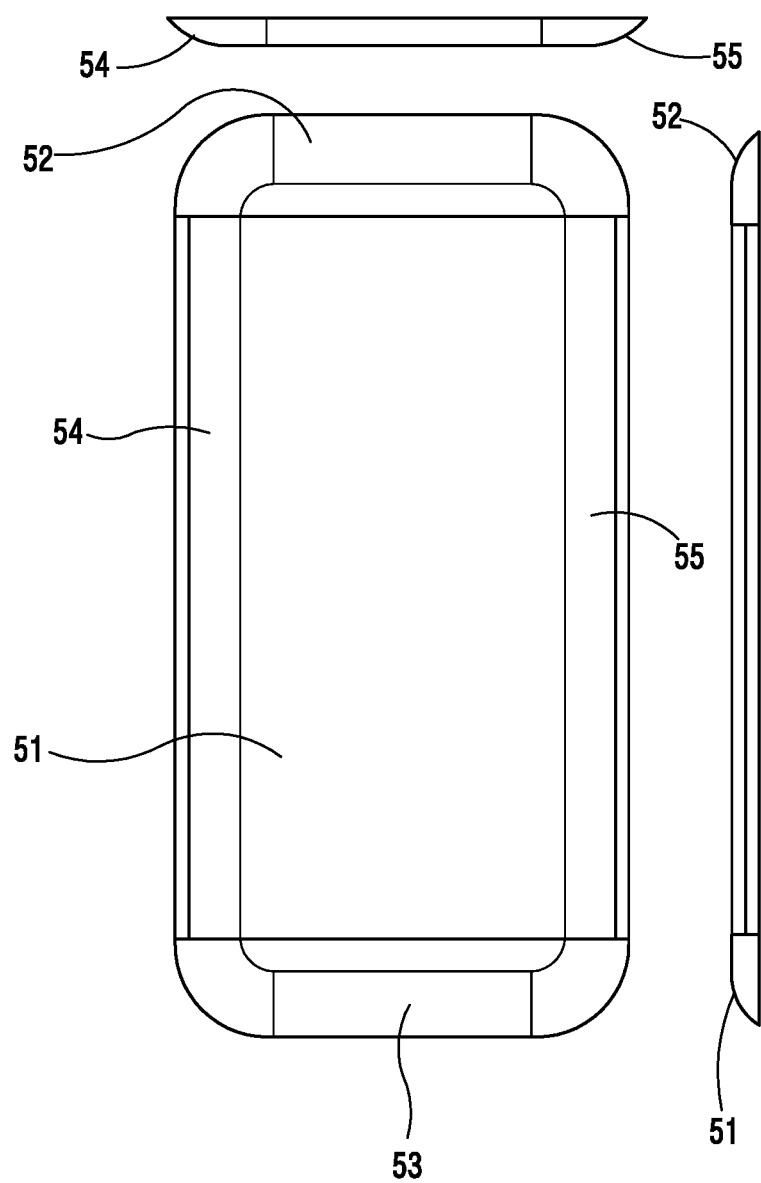
FIG. 13B is a perspective view showing the window which is mounted on the front surface or rear surface of the electronic device or on the front and rear surfaces of the electronic device, as viewed from the front side, upper side, and side, according to various embodiments of the present invention.

FIG. 13A is a perspective view showing a window which is mounted on a front surface or a rear surface, or on the front and rear surfaces of an electronic device according to various embodiments of the present invention. FIG. 13B is a perspective view showing the window which is mounted on the front surface or the rear surface or on the front and rear surfaces of the electronic device, as viewed from the front, top, and side, according to various embodiments of the present invention.

As shown in FIGS. 13A and 13B, the window 50 may be disposed on the front surface or the rear surface of the electronic device or may be disposed on the front and rear surfaces. That is, the window 50 may be applied as a front surface window or a rear surface window or a front and rear surface window. The window 50 may include a flat surface portion 51, and a left region 54, a right region 55, an upper region 52, and a lower region 53 which are curved surfaces. In this case, a corresponding display module may also be disposed in a corresponding shape.

According to various embodiments, the above-described window 50 may be formed in the 3D method such that its thickness is uniform from a display region to bending regions, and may have the same curvature or different curvatures.

Figure 14:
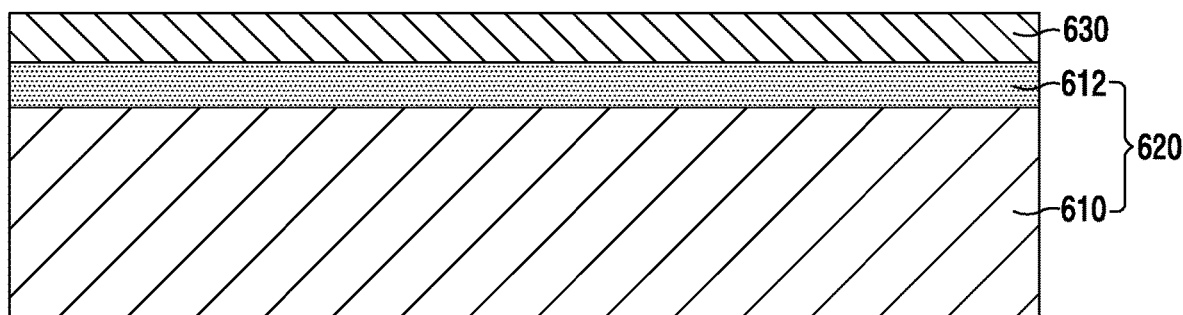
FIG. 14 is a cross sectional view showing a configuration of a polymer base according to various embodiments of the present disclosure.

FIG. 14 is a cross sectional view showing a configuration of a polymer base according to various embodiments of the present invention. The polymer base layer may be referred to as a polymer plate or a polymer sheet since it is formed of a polymer material and has a plate or sheet shape. In addition, a hard coating layer may be formed on the polymer base layer, and thus the term "polymer base layer" may be interchangeably used with a "high-hardness sheet." These may be a part or an entirety of the exterior surface mounting member.

Referring to FIG. 14, the exterior surface mounting member according to various embodiments of the present invention may include a polymer base layer 620 as a high-hardness sheet, and a high-hardness anti-scratch hard coating layer 630. The hard coating layer 630 may be coated over the polymer base layer 620. According to various embodiments, the polymer base layer 620 may be a transparent layer, and may be formed of a laminated material of poly methyl methacrylate (PMMA) 612 and poly carbonate (PC) 610, and may include an organic plate material having good optical performance such as high transmittance and unpolarization. The polymer base layer 620 may be configured by any one layer of a PC+PMMA laminated layer, a layer formed of a single PMMA layer, a layer formed of an optical PC sheet, a layer formed of a PMMA+special PMMA copolymer, a layer formed of a polyimide (PI) sheet, or layer formed of a PC+PI or PMMA+PI copolymer.

According to various embodiments, the high-hardness anti-scratch hard coating layer 630 may be configured by a hard coating layer which has flexibility without a crack even when a bending force less than or equal to 10 R is applied. When the bending force is less than or equal to 10 R, the hard coating layer 630 may have an exterior R value that can configure a part or an entirety of the exterior of the electronic device to have a circular shape. The high-hardness anti-scratch hard coating layer 630 may be formed of a high-hardness acrylate layer or a silica-based ($SiO_2$) glass film coating layer.

According to various embodiments, the high-hardness hard coating layer 630 may be formed as follows. According to various embodiments, the high-hardness hard coating layer 630 may include acrylate or silica ($SiO_2$) as a main component, and may have a high hardness higher than or equal to a pencil hardness 4H. In the above-described components, the acrylate component is more flexible, and the silica-based material has a higher hardness but is more likely to cause a crack according to an exterior fabricating condition and thus may be poorer in the aspect of manufacturing.

The hard coating layer 630 may include an anti-scratch property which withstands a 4H or higher hardness/steel wool test and an eraser abrasion test, and may additionally give various functionalities to the hard coating layer. Giving the functionalities may mean that a layer having the following component is additionally formed on the hard coating layer, or the following component is added to the main component of the hard coating layer as an additive. That is, the functionality may be given to the hard coating layer by adding the following additive to the main component of the hard coating layer. For example, when the layer is formed by adding an anti-reflective (AR) component or an anti-fingerprint (AF) component to the main component of the hard coating layer, the hard coating layer may provide an AR property and an AF property.

In a related-art layer forming method, a layer may be formed through respective coating processes for adding functions such as AF, IF, anti-glare (AG), AR to glass. However, according to the present invention, a complete product may be manufactured only through a thermal molding process with one layer.

For example, the AF property may be achieved by adding a fluoride resin to high-hardness acrylate which is the main component of the hard coating layer as an additive, and thus adding only water repellency or oil repellency to the characteristic of the hard coating layer.

In addition, in the case of AG, a layer may be added by mixing a hard coating solution with a particle causing anti-glare. However, the best method may be to add functionality by adding an additive to a coating solution of one layer.

The components that can be added to provide the functionalities may be as follows.

The AF component may be added as a water repellent or oil repellent coating material or may be applied as a water repellent or oil repellent coating layer. The AR component may mainly include a fluorine group and may be formed at a water contact angle of 100 degrees or higher.

The IF component may be added as a hydrophilic-oleophilic coating material or may be applied as a coating layer. The IF component may be formed at a water contact angle of 80 degrees or lower.

The AG component is a component for reducing reflection of light through diffused reflection by adding scattered particles, and may increase visibility in a natural light state.

Figure 15:
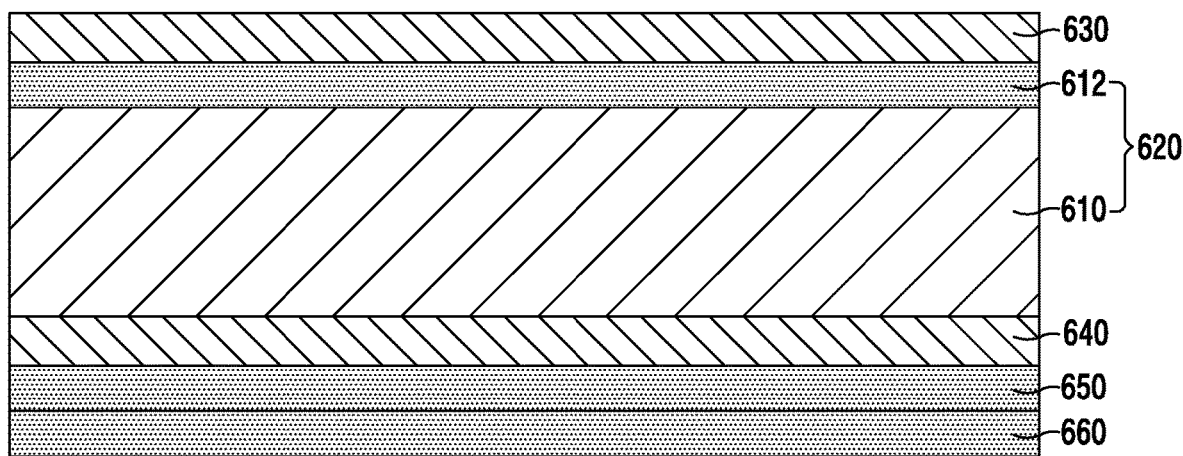
FIG. 15 is a cross sectional view showing a configuration of a planar exterior surface mounting member before being molded according to various embodiments of the present disclosure.

FIG. 15 is a cross sectional view showing a configuration of a planar exterior surface mounting member before being molded according to various embodiments of the present invention.

Referring to FIG. 15, the planar exterior surface mounting member according to various embodiments of the present invention may be formed by adding the following layers to the polymer base layer 620.

According to various embodiments, a UV molding layer 640 may be formed under the polymer base layer 620. The UV molding layer 640 may be a pattern layer for decoration or a decoration layer, and may have a plurality of patterns (decoration patterns) formed therein regularly or irregularly as various designs. The plurality of UV patterns may be formed in 2D or 3D. Since the exterior surface mounting member is positioned on the exterior surface of the electronic device, it may be a component that can be resistant to a scratch and should contribute to the exterior design of the electronic device. Accordingly, the exterior surface mounting component may include various visibility patterns. In addition, the UV molding layer 640 is not limited a single layer and may formed of a plurality of molding layers, for example, first and second molding layers, to decorate the exterior diversely.

According to various embodiments, the patterns may be lenticular patterns. The patterns may be applied to at least one of the front surface or the rear surface of the exterior member of the electronic device. The lenticular patterns may be applied as shapes protruding in the form of a plurality of repeated stripes, and the direction of the stripes may be a width direction, a length direction, or any possible direction of the electronic device. The protruding direction of the shapes protruding in the form of stripes may be a direction of going from the exterior member to the inside of the electronic device.

According to various embodiments of the present invention, the UV molding solution may be composed as follows.

The UV molding may use a soft UV molding solution for forming. The UV molding solution normally used for a glass or high-hardness sheet may use a molding solution having a slightly higher hardness. The specification of an existing UV molding solution may have a hardness higher than or equal to H. When the same UV molding solution as that of a flat surface, a UV molding crack may occur in a bending portion. The specifications of currently used UV molding solutions are shown in table 1 presented below:

TABLE 1

| UV molding solution product names | Types | Viscosity (nondimension) | Hardness (pencil hardness) |
|---|---|---|---|
| WHP-101 | Soft product for forming | 1600 | HB-F |
| WHP-102 | Soft product for forming | 1650 | HB |
| WHP-103 | Soft product for forming | 1700 | HB |
| WHP-104 | Soft product for forming | 1750 | HB |

In addition, a PVD layer 650 may further be formed under the UV molding layer 640. The PVD layer 650 may be a deposition layer which provides a color and a metallic feeling and may server as a color function of the exterior surface mounting member. In addition, a shield layer 660 may be printed under the PVD layer 650. The shield layer 660 may be black color, but is not limited thereto. The shield layer 660 may be formed in a printing method with heat-resistant ink.

The planar exterior surface mounting member configured as described above may be manufactured into an exterior surface mounting member having a 3D curved surface (curvature) by a molding process using a mold, which will be described below. At least one curved surface may be formed on the exterior surface mounting member and thus may occupy at least a region.

Hereinafter, molding equipment for thermal molding the planar exterior surface mounting member, for example, a mold 60, will be described.

Figure 16:
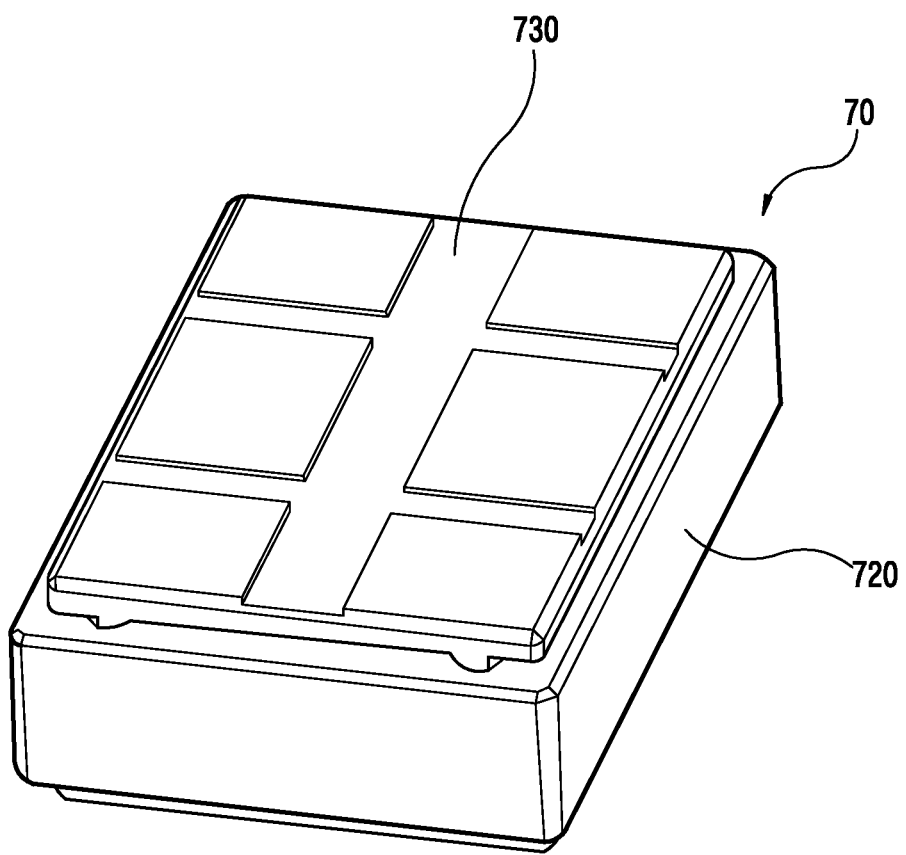
FIG. 16 is a perspective view showing a mold assembly for molding the planar exterior surface mounting member according to various embodiments of the present disclosure.
Figure 17A:
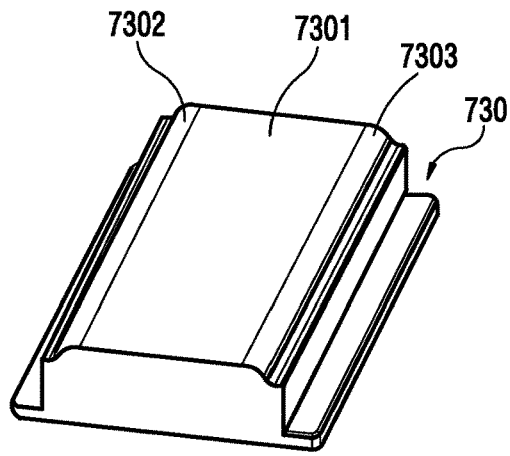
FIG. 17A is a perspective view showing an upper mold separate from a sleeve and a lower mold for molding the planar exterior surface mounting member according to various embodiments of the present disclosure.
Figure 17B:
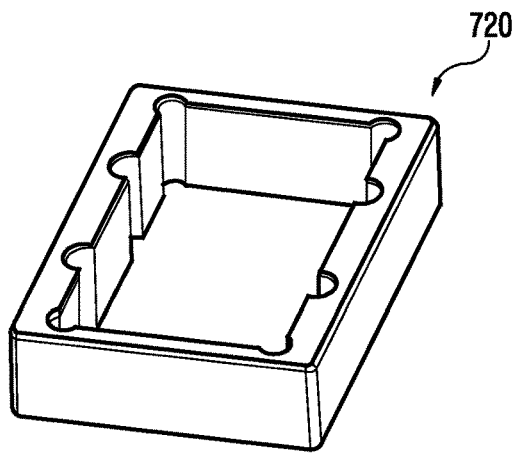
FIG. 17B is a perspective view showing a sleeve separate from an upper mold and a lower mold for molding the planar exterior surface mounting member according to various embodiments of the present disclosure.
Figure 17C:
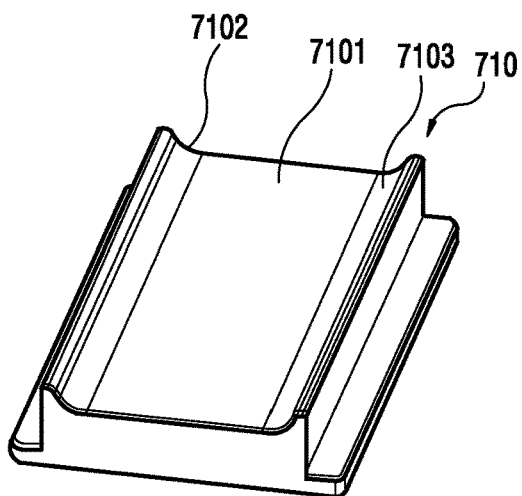
FIG. 17C is a perspective view showing a lower mold separate from an upper mold and a sleeve for molding the planar exterior surface mounting member according to various embodiments of the present disclosure.

FIG. 16 is a perspective view showing a mold assembly for molding a planar exterior surface mounting member according to various embodiments of the present invention. FIG. 17A is a perspective view showing an upper mold separate from a sleeve and a lower mold for molding the planar exterior surface mounting member according to various embodiments of the present disclosure. FIG. 17B is a perspective view showing a sleeve separate from an upper mold and a lower mold for molding the planar exterior surface mounting member according to various embodiments of the present disclosure. FIG. 17C is a perspective view showing a lower mold separate from an upper mold and a sleeve for molding the planar exterior surface mounting member according to various embodiments of the present disclosure.

Referring to FIGS. 16 and 17A-C, the mold 70 according to various embodiments may include the lower mold 710, the upper mold 730, and the sleeve 720. In addition, in the step of preparing the mold, CrN coating/DLC coating may be applied to the surface of the mold (to enhance a releasing property of the mold). Each of the upper mold 730 and the lower mold 710 may include a planar portion 7301, 7101 and curved portions 7302, 7303; 7102, 7103 to apply planar surfaces and curved surfaces to the exterior surface mounting member. The mold assembly may be completed by fitting the sleeve 620 over the lower mold 610 and then coupling the upper mold 630.

First, a planar exterior surface mounting member 800 (shown in FIG. 21) prepared according to various embodiments of the present invention is prepared. A protection vinyl may be attached to a rear surface of the prepared exterior surface mounting member 700. The protection vinyl may melt by heat, and may be used to separate a molded exterior surface mounting member 702 (shown in FIG. 22) from the mold 710 in an intact state.

A manufacturing device according to various embodiments of the present invention is a progressive type manufacturing device, and may perform various steps in sequence. For example, if first and second heating processes finish in 100 seconds and first and second cooling processes finish in 100 seconds, but a compressing process requires 200 seconds, each of the processes other than the compressing process should be performed for 200 seconds due to the compressing process.

According to various embodiments, a process that has the greatest effect on the exterior of a product normally requires the longest time. For example, when the compressing process is divided into two processes and each process is performed for 100 seconds twice, the total processes are six processes, that is, two heating processes, two compressing processes, and two cooling processes, and thus the number of molds increases by one pair, but time required to perform each step can be reduced to 100 seconds.

Hereinafter, a method for manufacturing an exterior surface mounting member according to various embodiments of the present invention will be described.

Figure 18:
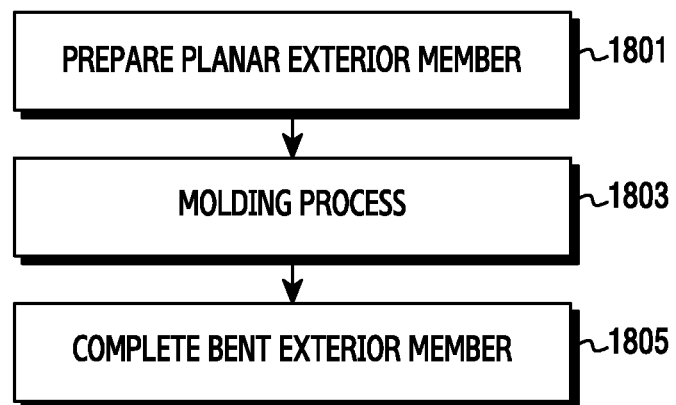
FIG. 18 is a flowchart showing a method for manufacturing an exterior member according to various embodiments of the present disclosure.

FIG. 18 is a flowchart showing a method for manufacturing an exterior member according to various embodiments of the present disclosure.

Referring to FIG. 18, a process of manufacturing an exterior surface mounting member according to various embodiments will be described. A planar exterior surface mounting member as shown in FIG. 15 is prepared (step 1801). A molding process (step 1803) may be performed after the prepared exterior surface mounting member is placed on the lower mold of the mold. After the molding process, the bent exterior surface mounting member may be released from the mold and then the finally bent exterior surface mounting member may be completed (step 1805).

A process of molding ab exterior surface mounting member according to various embodiments of the present disclosure will be described with reference to FIGS. 19 to 21.

Figure 19:
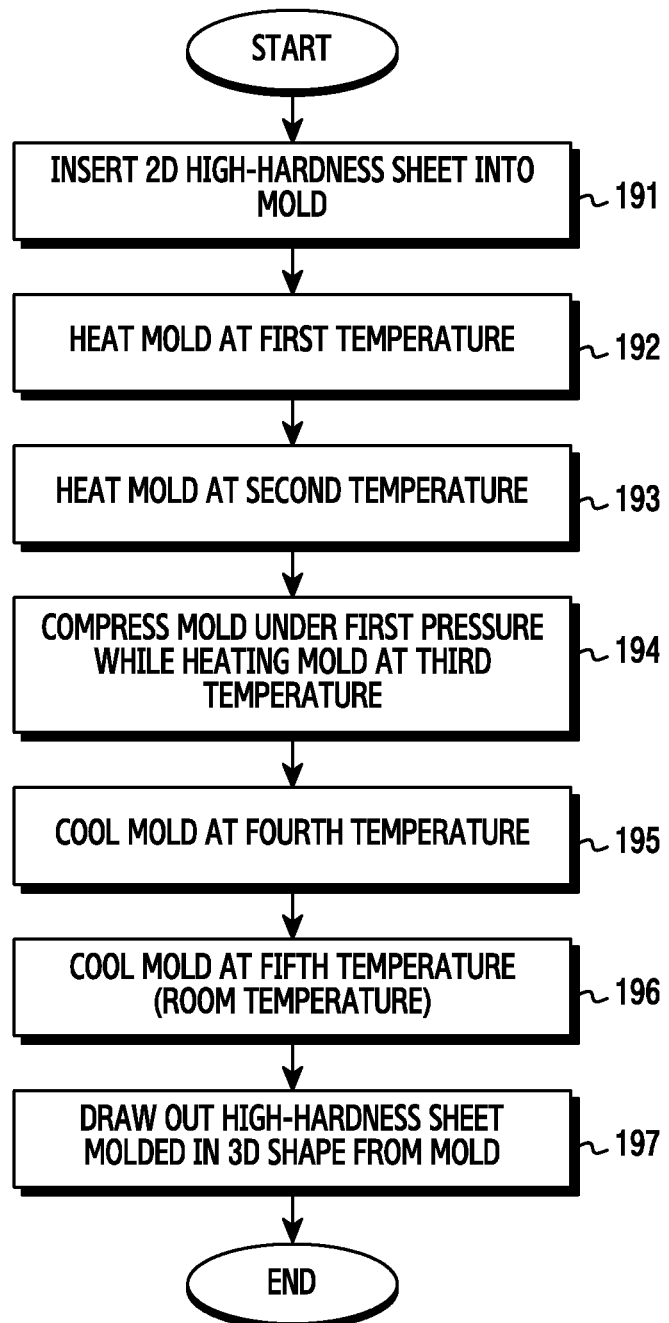
FIG. 19 is a flowchart showing a process of molding the exterior member according to various embodiments of the present disclosure.

FIG. 19 is a flowchart showing a process of molding an exterior member in detail according to various embodiments of the present invention. FIG. 20 is a cross sectional view showing a heating process which is performed after a planar exterior surface mounting member is placed in the mold according to various embodiments of the present invention. FIG. 21 is a cross sectional view showing a compressing process which is performed after the planar exterior surface mounting member is placed in the mold according to various embodiments of the present invention.

Figure 20:
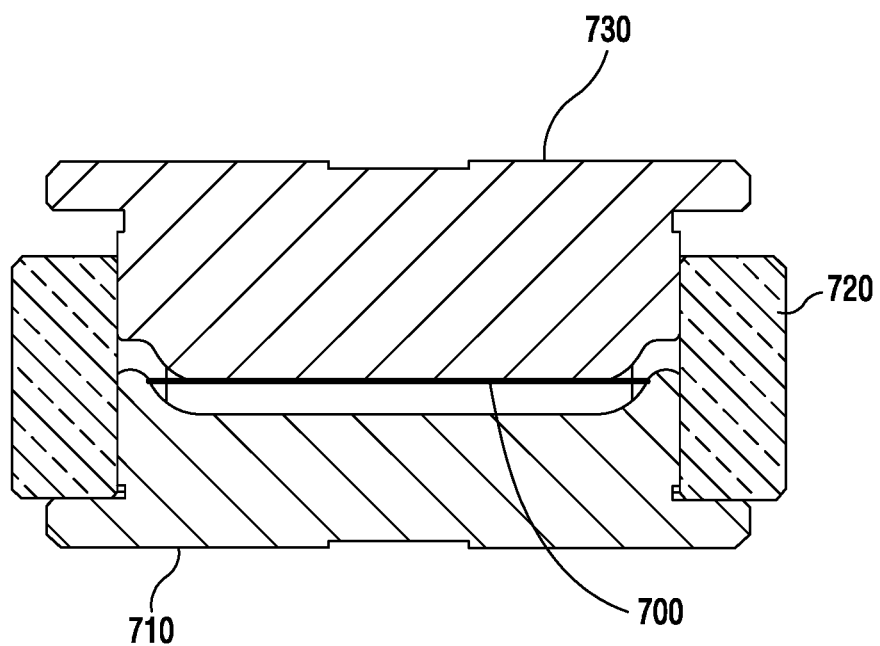
FIG. 20 is a cross sectional view showing a heating process which is performed after the planar exterior surface mounting member is placed in the mold according to various embodiments of the present disclosure.
Figure 21:
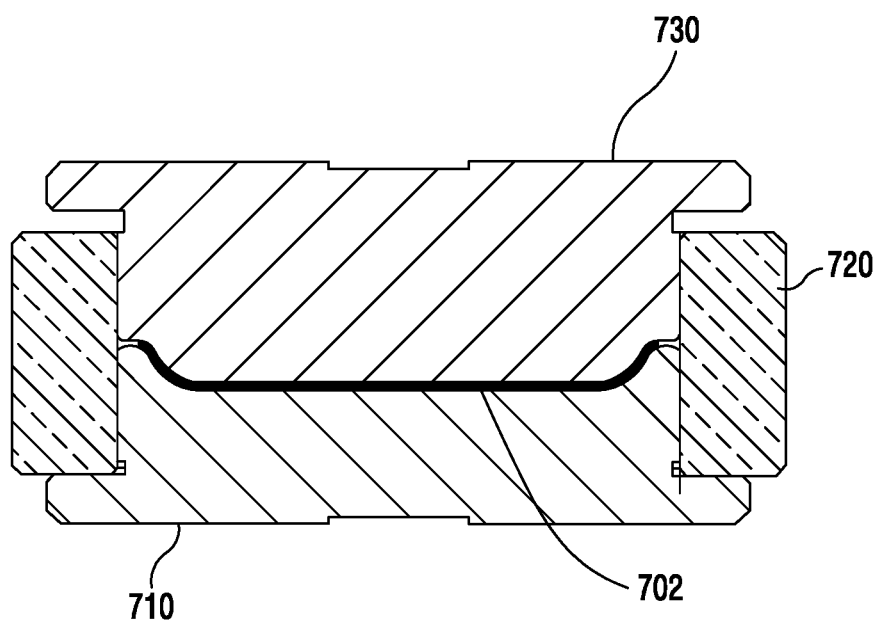
FIG. 21 is a cross sectional view showing a compressing process which is performed after the planar exterior surface mounting member is placed in the mold according to various embodiments of the present disclosure.

Referring to FIGS. 19 to 21, the process of molding the exterior surface mounting member 800 according to various embodiments may include a heating process, a compressing process, and a cooling process. FIG. 20 illustrates a mold state during the heating process, and FIG. 21 illustrates a mold state during the compressing process. When the exterior surface mounting member is manufactured with reference to the same lead time, a cycle time becomes shorter as the process is divided into more manufacturing steps. Therefore, the manufacturing property may be enhanced, but there is a disadvantage that the number of molds increases.

[Heating Process]

The heating process for the exterior surface mounting member according to various embodiments may include at least two heating processes. The heating process may be divided into two processes, that is, first and second heating processes. In the heating process, the mold into which the exterior surface mounting member as shown in FIG. 10 is inserted may be heated at a first temperature (between about 75 and 85 degrees). According to the first heating process, the exterior surface mounting member may increase flexibility of a material.

In the second heating process, the mold into which the exterior surface mounting member is secondarily heated at a temperature between about 90 and 110 degrees. According to the second heating process, the exterior surface mounting member may increase flexibility of a material, while mitigating a shock to a bent portion.

[Compressing Process]

The compressing process according to various embodiments may include at least one compressing process. In the compressing process, the mold may be compressed under a first pressure (about 2 bars to 5 bars) at a third temperature (120 to 140 degrees). Due to the compressing process, the exterior surface mounting member 900 may have curved portions as desired.

The molding is performed under a low pressure at a relatively very low temperature compared to a glass transition temperature, such that a dent can be prevented from occurring on the exterior, a shock and efflorescence on curved portions of corners can be prevented, a high-hardness hard coating layer peeling phenomenon can be prevented, and rear surface UV molding can be prevented from being transferred to the mold.

[Cooling Process]

The cooling process according to various embodiments may include at least two cooling processes. The cooling process may be divided into two processes, that is, first and second cooling processes. In the first cooling process, the exterior surface mounting member is cooled at a fourth temperature (between 55 and 65 degrees). According to the first cooling process, a XY-axis deformation of the exterior surface mounting member which may be caused by rapid cooling can be mitigated.

In the second cooling process, the exterior surface mounting member may be cooled at a fifth temperature (room temperature). The exterior surface mounting member 900 is released from the mold after the second cooling process is completed, and then the final exterior surface mounting member may be manufactured.

According to various embodiments, the cycle time may be 40-200 seconds according to each size and thickness. In addition, since the molding process is a progressive process, productivity can be enhanced and a multi-cavity can be implemented according to a size.

Figure 22:
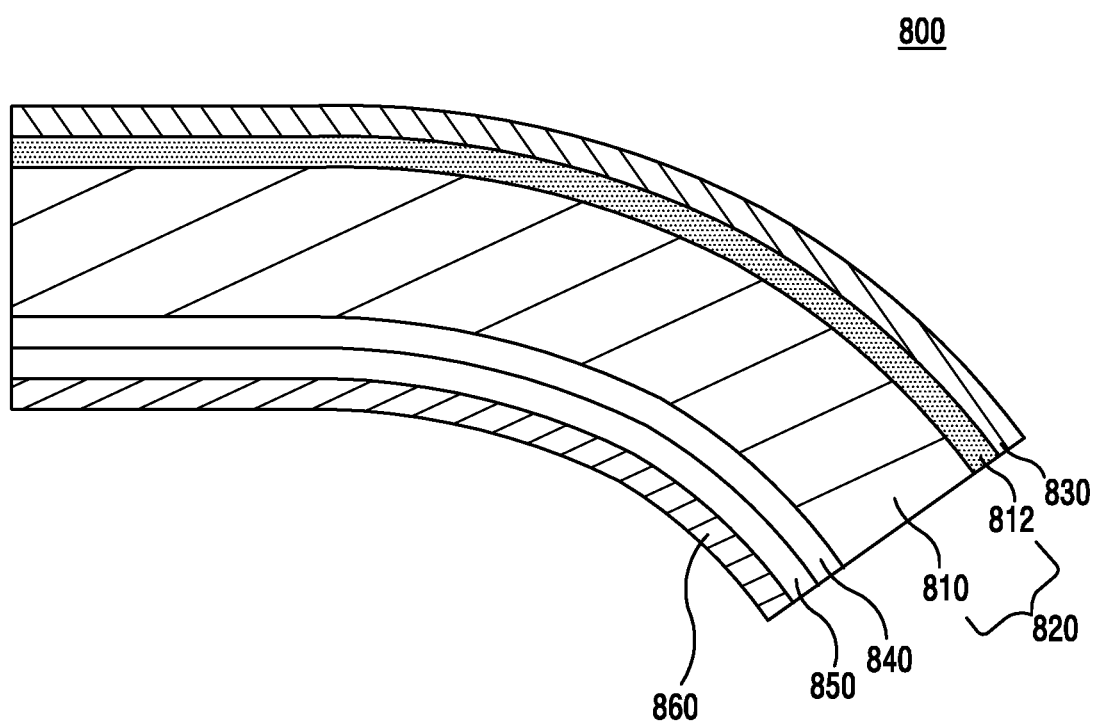
FIG. 22 is a cross sectional view showing a configuration of an exterior surface mounting member which is bent after being molded according to various embodiments of the present disclosure.

FIG. 22 is a cross sectional view showing a configuration of an exterior surface mounting member which is bent after being molded according to various embodiments of the present invention.

FIG. 22 is a cross sectional view showing the configuration of the finally manufactured exterior surface mounting member 800. The planar exterior surface mounting member shown in FIG. 15 is manufactured into the exterior surface mounting member 1800 having bent surfaces as shown in FIG. 22 through the molding process.

That is, the two-dimensional exterior surface mounting member is changed to the three-dimensional shape, that is, a bent shape. The exterior surface mounting member 800 manufactured through the molding process may be manufactured in a combination of a planar portion and a portion extending from the planar portion to have a curvature. The exterior surface mounting member 900 may be applied to a window of a curved or bendable flexible display having a curvature. According to various embodiments, the exterior surface mounting member may be employed in a smart phone, a flexible device, or a wearable device having a curved or bendable flexible display mounted thereon and having a curvature.

According to various embodiments of the present invention, the manufactured window (exterior surface mounting member) may further include a flexible display module formed on the rear surface thereof. The flexible display module may be configured to have the same or similar curvature as or to that of the window. The manufactured window may further include a penetrating hole for assembling with a peripheral component such as a receiver, a home key, or the like, and the decoration layer may further include a region of which at least a part is transparent or translucent in a component that should allow internal/external light to pass therethrough, such as a camera hole, a proximity light sensor hole, or the like.

Figure 23A:
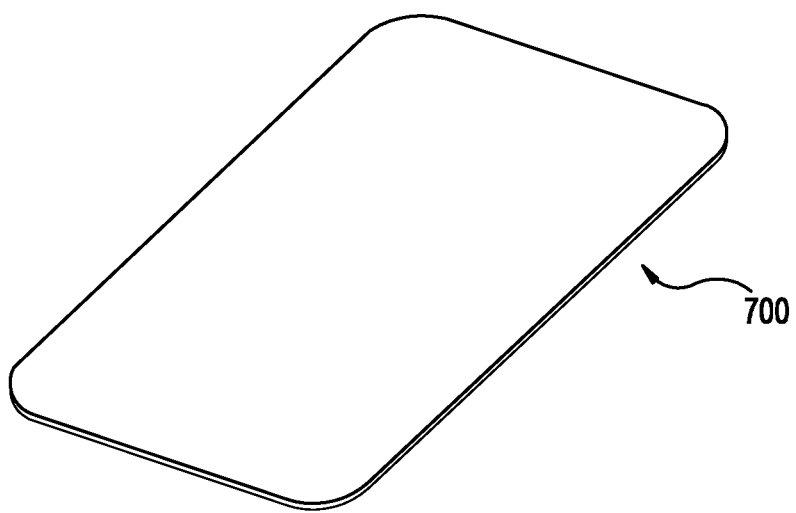
FIG. 23A is a view showing an exterior surface mounting member before a molding process according to various embodiments of the present disclosure.
Figure 23B:
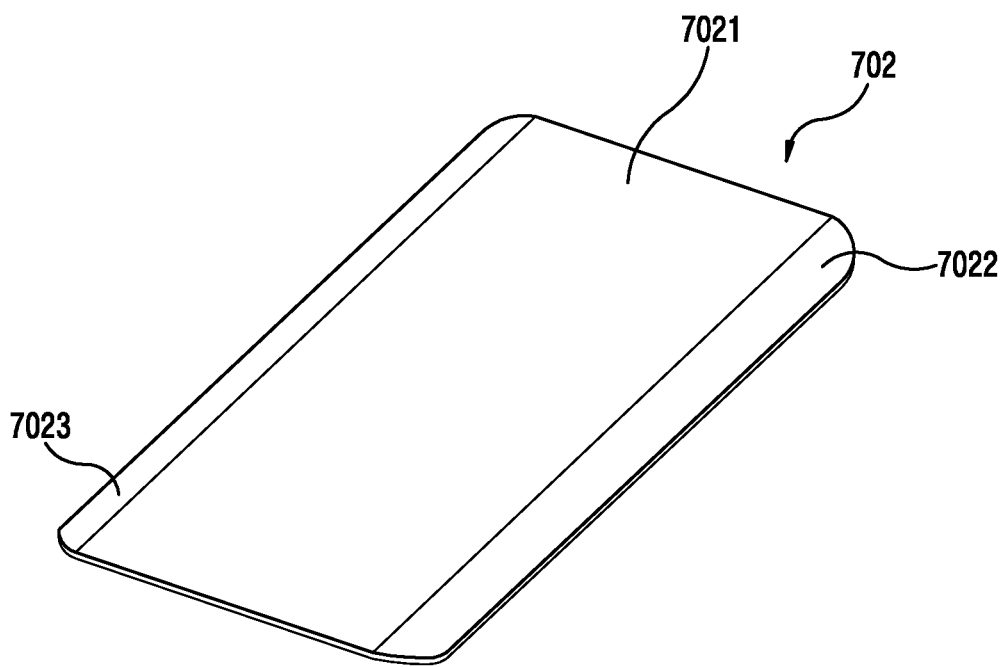
FIG. 23B is a view showing the exterior surface mounting member after the molding process according to various embodiments of the present disclosure.

FIG. 23A illustrates an exterior surface mounting member before the molding process according to various embodiments of the present invention, and FIG. 23B illustrates an exterior surface mounting member after the molding process according to various embodiments of the present invention.

With reference to FIGS. 23A and 23B, the exterior surface mounting member 700 before the molding process and the exterior surface mounting member 702 after the molding process will be described in comparison to each other. The exterior surface mounting member 700 before the molding process may be a planar member. The detailed configuration of the planar exterior surface mounting member 700 is illustrated in FIG. 15, and the configuration of the exterior surface mounting member 702 which is bent to have curved surfaces of which at least a part has a curvature after the molding process is illustrated in FIG. 22.

Figure 24A:
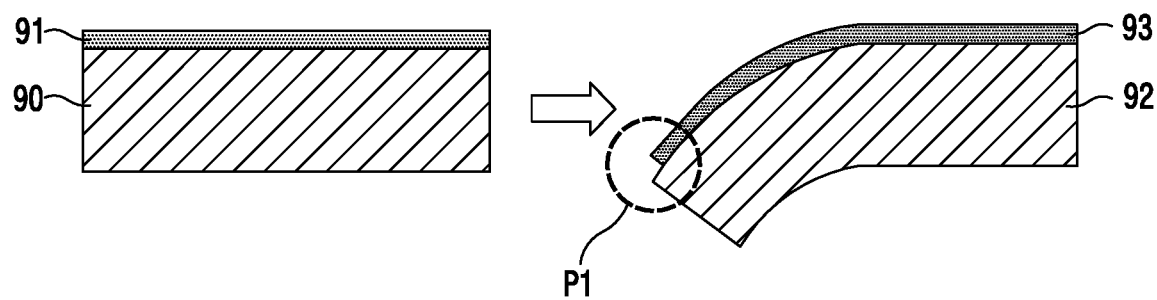
FIGS. 24A and 24B are views showing a protection vinyl which is provided on the exterior surface mounting member, but does not cover the exterior after the molding process according to various embodiments.
Figure 24B:
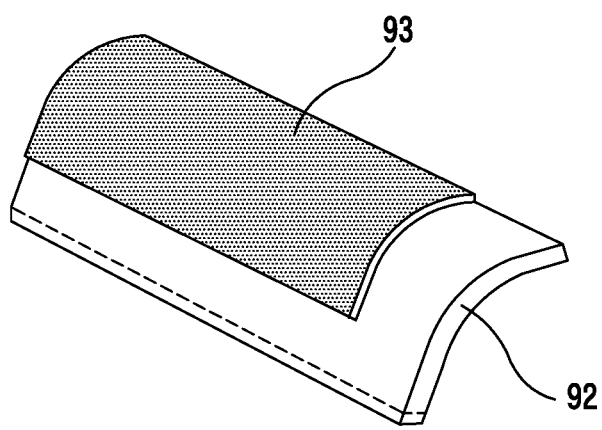
Figure 25:
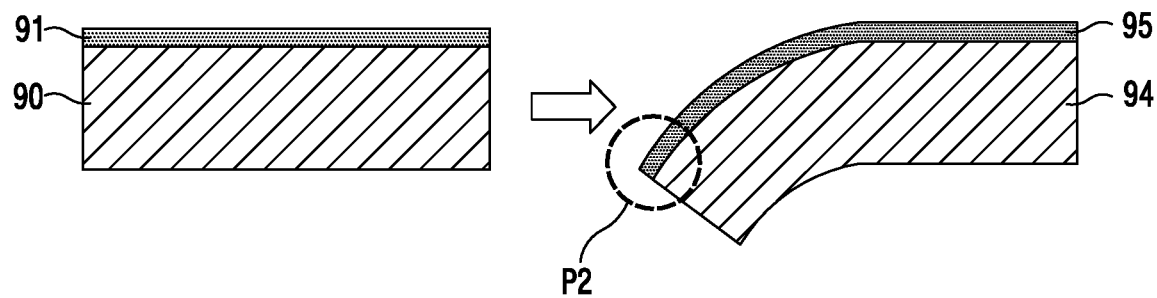
FIG. 25 is a view showing a protection vinyl which is provided on the exterior surface mounting member and covers the exterior after the molding process according to various embodiments.

The planar exterior surface mounting member 700 may be manufactured to have a planar portion 7021 and first and second bent portions 7021, 7023 by the molding process. The exterior surface mounting member 702 may be employed on the front surface window disposed on the front surface of FIG. 1. The exterior surface mounting member 702 may be formed in a shape corresponding to the flexible display. That is, various exterior surface mounting members corresponding to flexible displays of various shapes, that, windows of various shapes, may be manufactured. In addition, the planar portion may be deformed to have a gently curved surface, that is, a slight curvature. FIGS. 24A and 24B are views showing a protection vinyl which is provided on the exterior surface mounting member, but does not cover the exterior after the molding process according to various embodiments. FIG. 25 is a view showing a protection vinyl which is provided on the exterior surface mounting member and covers the exterior after the molding process according to various embodiments.

Referring to FIGS. 24A and 24B, a high-hardness sheet 90 (exterior surface mounting member) may further include a protection vinyl 91 formed on one surface thereof according to various embodiments of the present invention. The protection vinyl 91 may protect the high-hardness sheet from a scratch which may occur in the mold when the high-hardness sheet 90 is manufactured into a 3D shape through a thermal molding process, and may allow the sheet to be easily drawn out from the mold.

According to various embodiments of the present invention, the protection vinyl 91 may melt by heat. When the protection vinyl 90 is formed of a normal protection vinyl material such as PET, there is almost no deformation at a molding temperature, and thus the protection vinyl 90 may not cover the exterior of the high-hardness sheet (portion P1) as much as a length by which the high-hardness sheet 90 is extended through thermal molding, and a mark may be left on the exterior after molding.

Referring to FIG. 25, when a protection vinyl 91 is used at a molding temperature corresponding to a glass transition temperature, for example, 130 degrees or lower, the protection vinyl 91 may melt, thereby covering the exterior and thus covering a dent on the exterior of the high-hardness sheet (portion P2).

Embodiments disclosed in the present invention are suggested for easy explanation and understanding of the technical features disclosed herein and are not intended to limit the scope of various embodiments of the present invention. Therefore, the scope of various embodiments of the present invention should be interpreted as including all changes based on the technical idea of various embodiments of the present invention or various other embodiments.

What is claimed is:

1. A portable communication device comprising:
   a display facing a front side of the portable communication device; and
   a rear cover forming a rear side of the portable communication device opposite of the front side, the rear cover including a flat portion and a curved portion extended from the flat portion and forming at least part of a lateral side of the portable communication device, wherein the rear cover includes:
   a coating layer having a pencil hardness of 4H or more, one side of the coating layer forming an outer surface of the rear cover; and
   a polymer layer disposed under the coating layer, the polymer layer comprising a poly methyl methacrylate (PMMA) layer, and a poly carbonate (PC) layer disposed under the PMMA layer,
   wherein the coating layer, the PMMA layer, and the PC layer comprise a curved surface portion forming the curved portion of the rear cover.

2. The portable communication device of claim 1, wherein the rear cover includes an ultraviolet (UV) molding layer disposed under the PC layer and covering a substantially entire area of the flat portion.

3. The portable communication device of claim 2, wherein the curved portion includes a first curved surface having a first curvature and a second curved surface having a second curvature, and wherein the UV molding layer covers a substantially entire area of the first curved surface and a substantially entire area of the second curved surface.

4. The portable communication device of claim 2, wherein the flat portion includes an opening through which a camera or a sensor is exposed, and wherein the UV molding layer covers the substantially entire area of the rear cover except the opening.

5. The portable communication device of claim 2, wherein the UV molding layer includes one or more decoration patterns formed therein.

6. The portable communication device of claim 2, wherein the rear cover includes a vapor deposition layer formed under the UV molding layer.

7. The portable communication device of claim 6, wherein the vapor deposition layer forms a physical vapor deposition layer.

8. The portable communication device of claim 6, wherein the rear cover includes one or more decoration patterns formed above the vapor deposition layer.

9. The portable communication device of claim 2, the rear cover includes a shield layer formed under the UV molding layer.

10. The portable communication device of claim 9, wherein the shield layer includes a component for providing a heat-resisting property.

11. The portable communication device of claim 1, wherein the coating layer includes an acrylate having a pencil hardness of 4H or more.

12. The portable communication device of claim 1, wherein the coating layer includes a component for providing at least one of anti-fingerprint (AF) property, anti-reflective (AR) property, or anti-glare (AG) property.

13. A portable communication device comprising:
a display facing a front side of the portable communication device; and
a rear cover including a flat portion forming a rear side of the portable communication device opposite of the front side, and a curved portion extended from the flat portion and forming at least part of a lateral side of the portable communication device, the rear cover including:
a coating layer with a pencil hardness of 4H or more, one side of the coating layer forming an outer surface of the rear cover;
a polymer layer disposed under the coating layer, the polymer layer comprising a poly methyl methacrylate (PMMA) layer disposed under the coating layer, and a poly carbonate (PC) layer disposed under the PMMA layer;
a vapor deposition layer under the PC layer; and
a shield layer formed under the vapor deposition layer,
wherein the coating layer, the PMMA layer, the PC layer, the vapor deposition layer, and the shield layer comprise a curved surface portion forming the curved portion of the rear cover.

14. The portable communication device of claim 13, wherein the rear cover includes one or more decoration patterns formed between the PC layer and the vapor deposition layer.

15. The portable communication device of claim 13, wherein the coating layer includes an acrylate having a pencil hardness of 4H or more.

16. An electronic device comprising:
a display disposed at a front side of the electronic device; and
a rear cover disposed at a rear side of the electronic device, and
wherein the rear cover comprises:
a coating layer with a pencil hardness of 4H or more, one side of the coating layer forms an outer surface of the rear cover;
a polymer layer disposed under the coating layer, the polymer layer comprising a poly methyl methacrylate (PMMA) layer disposed under the coating layer, and a poly carbonate (PC) layer disposed under the PMMA layer;
a decoration layer disposed under the PC layer
a vapor deposition (VD) layer disposed under the decoration layer; and
a shield layer disposed under the VD layer.

17. The electronic device of claim 16, wherein the rear cover further comprises a flat portion, and
wherein the coating layer, the PMMA layer, the PC layer, the decoration layer, the VD layer, and the shield layer are disposed to substantially cover all of the flat portion of the rear cover.

18. The electronic device of claim 17, wherein the rear cover further comprises a curved portion extended from the flat portion and having a predetermined curvature, and
wherein the coating layer, the PMMA layer, the PC layer, the decoration layer, the VD layer, and the shield layer are disposed to substantially cover all of the flat portion and the curved portion of the rear cover.

19. The electronic device of claim 18, wherein the curved portion further comprises a first curved surface configured to have a first curvature and a second curved surface configured to have a second curvature.

20. The electronic device of claim 17, wherein the flat portion of the rear cover further comprises an opening where a camera or at least one sensor is exposed, and
wherein the coating layer, the PMMA layer, the PC layer, the decoration layer, the VD layer, and the shield layer are disposed to substantially cover all of the rear cover except the opening.

21. The electronic device of claim 16, wherein the decoration layer has decoration patterns, and
wherein the decoration patterns are lenticular patterns having repeated stripes in a given direction.

22. The electronic device of claim 16, wherein the coating layer further comprises a high-hardness acrylate.

23. The electronic device of claim 16, wherein the coating layer further comprises a component for providing at least one of anti-fingerprint (AF) property, anti-reflective (AR) property, or anti-glare (AG) property.

* * * * *